(12) United States Patent
Numata

(10) Patent No.: US 11,705,445 B2
(45) Date of Patent: Jul. 18, 2023

(54) SEMICONDUCTOR DEVICE MANUFACTURING METHOD AND SEMICONDUCTOR DEVICE

(71) Applicant: Kioxia Corporation, Tokyo (JP)

(72) Inventor: Hideo Numata, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/459,432

(22) Filed: Aug. 27, 2021

(65) Prior Publication Data

US 2022/0293581 A1 Sep. 15, 2022

(30) Foreign Application Priority Data

Mar. 15, 2021 (JP) .................. 2021-041370

(51) Int. Cl.
*H01L 25/065* (2023.01)
*H01L 21/768* (2006.01)
(Continued)

(52) U.S. Cl.
CPC ........ *H01L 25/50* (2013.01); *H01L 21/76898* (2013.01); *H01L 21/78* (2013.01);
(Continued)

(58) Field of Classification Search
CPC ........... H01L 25/0657; H01L 25/06541; H01L 24/94; H01L 2224/32145
See application file for complete search history.

(56) References Cited

U.S. PATENT DOCUMENTS 10,128,223 B2 * 11/2018 Kawasaki ............... H01L 24/09
10,497,688 B2  12/2019 Tsukiyama et al.
(Continued)

FOREIGN PATENT DOCUMENTS

JP  2010-004048 A  1/2010
JP  2011-071470 A  4/2011
(Continued)

*Primary Examiner* — Dale E Page
*Assistant Examiner* — Wilner Jean Baptiste
(74) *Attorney, Agent, or Firm* — Foley & Lardner LLP

(57) ABSTRACT

In a semiconductor device manufacturing method, a stacked substrate is formed. In the stacked substrate, a substrate is stacked repeatedly multiple times. The substrate includes a plurality of chip regions. In the semiconductor device manufacturing method, the stacked substrate is cut in a stacking direction among the plurality of chip regions, to separate the stacked substrate into a plurality of stacked bodies. In forming the stacked substrate, a first main surface of a first substrate and a second main surface of a second substrate are bonded to each other. In forming the stacked substrate, in a state where the second main surface is bonded to the first main surface, a third main surface of the second substrate opposite to the second main surface is thinned. In forming the stacked substrate, the third main surface of the second substrate and a fourth main surface of a third substrate are bonded to each other. In forming the stacked substrate, in a state where the fourth main surface is bonded to the third main surface, a fifth main surface of the third substrate opposite to the fourth main surface is thinned.

4 Claims, 22 Drawing Sheets

(51) Int. Cl.
  *H01L 25/00*   (2006.01)
  *H01L 23/00*   (2006.01)
  *H01L 21/78*   (2006.01)

(52) U.S. Cl.
  CPC .............. *H01L 24/19* (2013.01); *H01L 24/20* (2013.01); *H01L 24/32* (2013.01); *H01L 24/82* (2013.01); *H01L 24/83* (2013.01); *H01L 24/94* (2013.01); *H01L 25/0657* (2013.01); *H01L 2224/211* (2013.01); *H01L 2224/32145* (2013.01); *H01L 2224/8203* (2013.01); *H01L 2225/06541* (2013.01)

(56) References Cited

U.S. PATENT DOCUMENTS

| | | |
|---|---|---|
| 2009/0315189 A1 | 12/2009 | Sasaki et al. |
| 2011/0068456 A1 | 3/2011 | Sasaki et al. |
| 2011/0115085 A1 | 5/2011 | Kuwabara |
| 2012/0013024 A1 | 1/2012 | Sasaki et al. |
| 2012/0248579 A1 | 10/2012 | Endo |
| 2013/0234339 A1 | 9/2013 | Higashi et al. |
| 2014/0043883 A1 | 2/2014 | Leedy |
| 2015/0262989 A1 | 9/2015 | Kawasaki et al. |
| 2016/0079222 A1 | 3/2016 | Sato |
| 2017/0287889 A1* | 10/2017 | Kawasaki ............... H01L 24/92 |
| 2019/0115277 A1 | 4/2019 | Yu et al. |

FOREIGN PATENT DOCUMENTS

| | | |
|---|---|---|
| JP | 2012-023332 A | 2/2012 |
| JP | 2012-204653 A | 10/2012 |
| JP | 2012-221998 A | 11/2012 |
| JP | 2013-077767 A | 4/2013 |
| JP | 2014-071932 A | 4/2014 |
| TW | 201535669 A | 9/2015 |

* cited by examiner

SEMICONDUCTOR DEVICE MANUFACTURING METHOD AND SEMICONDUCTOR DEVICE

CROSS-REFERENCE TO RELATED APPLICATION(S)

This application is based upon and claims the benefit of priority from Japanese Patent Application No. 2021-041370, filed Mar. 15, 2021, the entire contents of which are incorporated herein by reference.

FIELD

Embodiments described herein relate generally to a semiconductor device manufacturing method and a semiconductor device.

BACKGROUND

A semiconductor device in which a plurality of chips is stacked may be formed. At this time, it is desired to improve the mounting density of the semiconductor device.

DETAILED DESCRIPTION

Figure 1A:
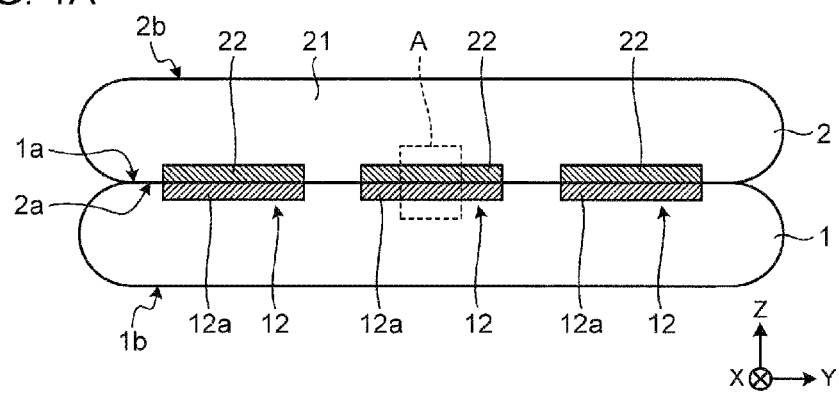
FIGS. 1A to 1C are cross-sectional views illustrating a semiconductor device manufacturing method according to a first embodiment.

Embodiments provide a semiconductor device manufacturing method which is capable of easily improving the mounting density, and a semiconductor device.

In general, according to at least one embodiment, a semiconductor device manufacturing method is provided. In the semiconductor manufacturing method, a stacked substrate is formed. In the stacked substrate, a substrate is stacked repeatedly multiple times. The substrate includes a plurality of chip regions. In the semiconductor device manufacturing method, the stacked substrate is cut in a stacking direction among the plurality of chip regions, to separate the stacked substrate into a plurality of stacked bodies. In forming the stacked substrate, a first main surface of a first substrate and a second main surface of a second substrate are bonded to each other. In forming the stacked substrate, in a state where the second main surface is bonded to the first main surface, a third main surface of the second substrate opposite to the second main surface is thinned. In forming the stacked substrate, the third main surface of the second substrate and a fourth main surface of a third substrate are bonded to each other. In forming the stacked substrate, in a state where the fourth main surface is bonded to the third main surface, a fifth main surface of the third substrate opposite to the fourth main surface is thinned.

A semiconductor device manufacturing method according to each embodiment will be described in detail with reference to the accompanying drawings. The present disclosure is not limited to the embodiments.

First Embodiment

In a semiconductor device manufacturing method according to a first embodiment, a package in which a plurality of chips is stacked is manufactured as a semiconductor device.

In at least one embodiment, bonding and thinning of substrates are repeated multiple times to form a stacked substrate, and the stacked substrate is cut in the stacking direction among chip regions.

FIGS. 1A to 6C illustrate the manufacturing of the semiconductor device. FIGS. 1A to 1C, 3A to 3C, 5A to 5C, and 6A to 6C are cross-sectional views illustrating the semiconductor device manufacturing method. FIG. 2A is an enlarged cross-sectional view of a portion A of FIG. 1A. FIGS. 2B and 2C are cross-sectional views illustrating details of the step of FIG. 1B, and are enlarged cross-sectional views of a portion B of FIG. 1B. FIG. 2D is a cross-sectional view illustrating the step of FIG. 1C, and is an enlarged cross-sectional view of a portion C of FIG. 1C. FIG. 4C is a cross-sectional view illustrating details of the step of FIG. 3B, and is an enlarged cross-sectional view of the portion B of FIG. 3B. FIG. 4D is a cross-sectional view illustrating the step of FIG. 3C, and is an enlarged cross-sectional view of a portion C of FIG. 3C. Hereinafter, the direction perpendicular to the front surface 1a of a substrate 1 is defined as the Z direction, and the two directions perpendicular to each other within the plane perpendicular to the Z direction are defined as the X direction and the Y direction.

In the step of FIG. 1A, substrates 1 and 2 are prepared. Each of the substrates 1 and 2 has a substantially disk shape, and has a substantially circular shape in the XY plane view. Each of the substrates 1 and 2 may be formed of a material that contains a semiconductor (e.g., silicon) as a main component.

Figure 2A:
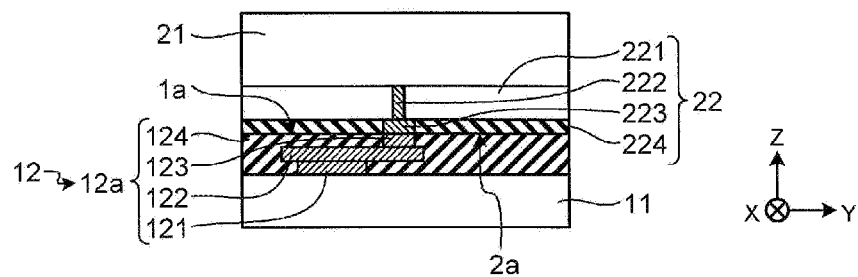
FIGS. 2A to 2D are enlarged cross-sectional views illustrating the semiconductor device manufacturing method according to the first embodiment.

For example, as illustrated in FIG. 2A, a plurality of chip regions 12 is formed in the front surface 1a of the substrate 1. In each chip region 12, for example, a conductive pattern and an interlayer insulating film that fills the periphery thereof are formed as a device pattern on a base region 11. In each chip region 12, for example, a pattern of a memory device that includes memory cell arrays and peripheral circuits may be formed. The base region 11 is formed of a material that contains a semiconductor such as silicon as a main component. For example, the chip region 12 may include the peripheral circuits capable of controlling the memory device of the chip region 22, the chip region 32, the chip region 42, the chip region 52, the chip region 62, the chip region 72, and the chip region 82.

For example, as illustrated in FIG. 2A, in the chip region 12, an electrode 121, a conductive film 122, and an electrode 123 are deposited in this order on the +Z side of the base region 11, and an inorganic insulating film 124 is formed to fill the peripheries thereof. As a result, a rewiring layer 12a is formed including the electrode 121, the conductive film 122, the electrode 123, and the inorganic insulating film 124. The −Z-side surface of the electrode 121 is continuous to the −Z-side surface of the inorganic insulating film 124, and the +Z-side surface of the electrode 121 is in contact with the conductive film 122. The −Z-side surface of the conductive film 122 is in contact with the electrode 121, and the +Z-side surface of the conductive film 122 is in contact with the electrode 123. The −Z-side surface of the electrode 123 is in contact with the electrode 122, and the +Z-side surface of the electrode 123 is continuous to the +Z-side surface of the inorganic insulating film 124. Each of the electrode 121, the conductive film 122, and the electrode 231 may be formed of a material that contains a metal such as copper as a main component. The inorganic insulating film 232 may be formed of a material that contains silicon oxide and/or silicon nitride as a main component.

For example, as illustrated in FIG. 2A, a plurality of chip regions 22 is formed on the front surface 2a of the substrate 2 of FIG. 1A. In each chip region 22, for example, a conductive pattern and an interlayer insulating film that fills the periphery thereof are formed as a device pattern on a base region 21. In addition, a memory device including a memory cell array and peripheral circuits can be formed. The base region 21 is formed of a material that contains a semiconductor (e.g., silicon) as a main component.

For example, as illustrated in FIG. 2A, in the chip region 22, a device structure 221 is formed in the base region 21 and/or on the base region 21. The device structure 221 includes, for example, a conductive pattern and an interlayer insulating film that fills the periphery thereof. A through via hole is formed in the device structure 221, and a conductive material is embedded in the through via hole, so as to form a through via 222. An inorganic insulating film is deposited on the front surface of the device structure 221, an opening is formed therein, and a conductive material is embedded in the opening, so as to form an electrode 223 and an inorganic insulating film 224. The +Z-side surface of the electrode 223 is in contact with the predetermined conductive pattern in the device structure 221, so as to be electrically connected to the predetermined conductive pattern. The −Z-side surface of the electrode 223 is exposed to form a portion of the front surface 2a, and the −Z-side surface of the inorganic insulating film 224 is exposed to form another portion of the front surface 2a. The electrode 223 may be formed of a material that contains a metal such as copper as a main component. The inorganic insulating film 224 may be formed of a material that contains silicon oxide and/or silicon nitride as a main component.

As illustrated in FIG. 1A, the front surface 2a of the substrate 2 is bonded to the front surface 1a of the substrate 1. For example, the front surface 1a of the substrate 1 and the front surface 2a of the substrate 2 face each other in the Z direction, and the XY position of the substrate 1 and the XY position of the substrate 2 are adjusted such that the XY positions of the chip regions 12 and the XY positions of the chip regions 22 are aligned. The substrates 1 and 2 are relatively close to each other in the Z direction so as to be bonded to each other.

The front surface 2a of the substrate 2 may be bonded to the front surface 1a of the substrate 1 through a direct bonding. For example, the front surface 1a of the substrate 1 and the front surface 2a of the substrate 2 are each activated by plasma, and the substrate 2 comes into close contact with the substrate 1, so that the substrate 2 is temporarily bonded to the substrate 1. Then, the substrate 2 is heated so as to be finally bonded to the substrate 1. When the direct bonding is performed, the gap between the bonding surfaces may be reduced, as compared with a case where an adhesive layer such as a bump electrode or a DAF is interposed. That is, the distance between the front surfaces 1a and 2a in the Z direction may be reduced.

For example, as illustrated in FIG. 2A, the electrode 123 disposed in the front surface 1a and the electrode 223 disposed in the front surface 2a are bonded to each other, and the inorganic insulating film 124 disposed in the front surface 1a and the inorganic insulating film 224 disposed on the front surface 2a are bonded to each other. That is, when the front surface 1a of the substrate 1 is irradiated with plasma, the front surface of the inorganic insulating film 124 is terminated by a hydroxyl group, and when the front surface 2a of the substrate 2 is irradiated with plasma, the front surface of the inorganic insulating film 224 is terminated by a hydroxyl group. When the substrate 2 is brought into close contact with the substrate 1, the front surface of the inorganic insulating film 224 and the front surface of the inorganic insulating film 124 are bonded to each other by a hydrogen bond through water molecules bonded to the hydroxyl groups. At this time, the bonding interface gap is defined as G1.

Then, when a heating is performed, the electrodes 124 and 223 are alloy-bonded to each other. At the same time, the water molecules escape from the bonding interface between the inorganic insulating film 224 and inorganic insulating film 124, so that the hydrogen bond of the water molecules changes into the hydrogen bond of the hydroxyl groups or a covalent bond via oxygen atoms. As a result, the bonding interface width between the front surface 2*a* of the substrate 2 and the front surface 1*a* of the substrate 1 is narrowed from G1 to G2 (<G1). Further, as the bonding process is progressed, the water molecules escape from the hydrogen bond of the hydroxyl groups at the bonding interface between the substrates 1 and 2, so that the hydrogen bond changes into the covalent bond via oxygen atoms. As a result, the bonding interface gap between the front surface 2*a* of the substrate 2 and the front surface 1*a* of the substrate 1 is narrowed from G2 to G3 (<<G2), so that the inorganic insulating films 124 and 224 of the front surfaces are finally bonded to each other in a substantially integrated form.

Figure 1B:
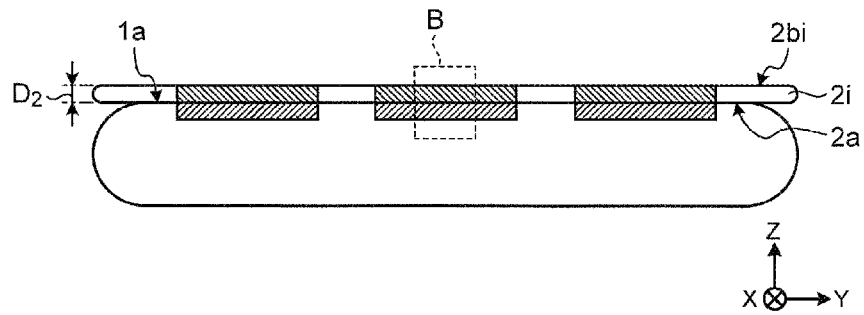

In the step illustrated in FIG. 1B, the back surface 2*b* of the substrate 2 is thinned in a state where the front surface 2*a* is bonded to the front surface 1*a* of the substrate 1. For example, a grinder which is a polishing device is pressed against the back surface 2*b* of the substrate 2 and rotates about an axis perpendicular to the contact surface, and the rotation is continued until the thickness of a substrate 2*i* reaches a desired thickness D2. At this time, since the front surface 2*a* is bonded to the front surface 1*a* of the substrate 1, the back surface 2*bi* may be stably polished while the substrate 2 is supported flatly. Further, since the substrate 2 is supported flatly by the substrate 1, the desired thickness D2 may be made as thin as possible.

Figure 2B:
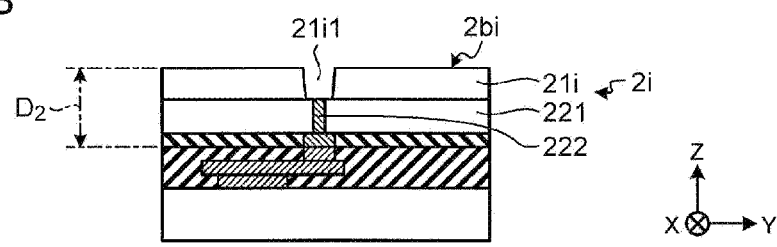

For example, as illustrated in FIG. 2B, a base region 21*i* may be thinned to a thickness that is a lower limit for achieving the reliability of the device structure 221. At this time, the substrate 2*i* may be completely removed. As a result, the thickness of the substrate 2*i* may be thinned to the desired thickness D2. After the substrate 2*i* is thinned, a through via hole 21*i*1 is formed in the substrate 2*i*. The through via hole 21*i*1 penetrates the base region 21*i* from the back surface 2*bi* in the Z direction, and reaches the +Z-side surface of the through via 222, to expose the +Z-side surface of the through via 222.

Figure 2C:
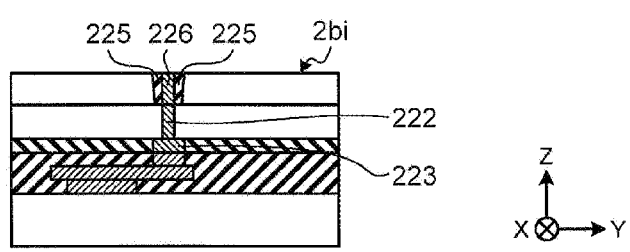

Then, as illustrated in FIG. 2C, an insulating film 225 is deposited on the side surface and the bottom surface of the through via hole 21*i*1 by the CVD method or the like. A portion of the bottom surface of the deposited insulating film 225 is selectively removed by the RIE method or the like, to expose the +Z-side surface of the through via 222 again. Then, a conductive material such as copper is embedded in the through via hole 21*i*1 by a plating method or the like, so as to form a through via 226. The −Z-side end of the through via 226 is in contact with the +Z-side surface of the through via 222, to be electrically connected to the electrode 223 via the through via 222.

When an adhesive layer such as a DAF is used for bonding the substrates 1 and 2 to each other, the substrate 2*i* and the substrate 1 may be heated to a temperature at which a high-quality insulating film is formable in depositing the insulating film on the side surface and the bottom surface of the through via hole 21*i*1. At this time, the adhesive layer may be melted, which deteriorates the flatness of the bonding interface, or the adhesive layer may be evaporated due to a carbonization, which deteriorates the adhesiveness of the bonding interface.

Meanwhile, in at least one embodiment, for example, the direct bonding is performed for bonding the substrate 2 and the substrate 1 to each other, without using the adhesive layer. Thus, the problem described above may be avoided, so that the substrate 2*i* and the substrate 1 may be heated to the temperature at which the high-quality insulating film is formable. As a result, the high-quality insulating film 225 may be deposited on the side surface of the through via hole 21*i*1.

Figure 1C:
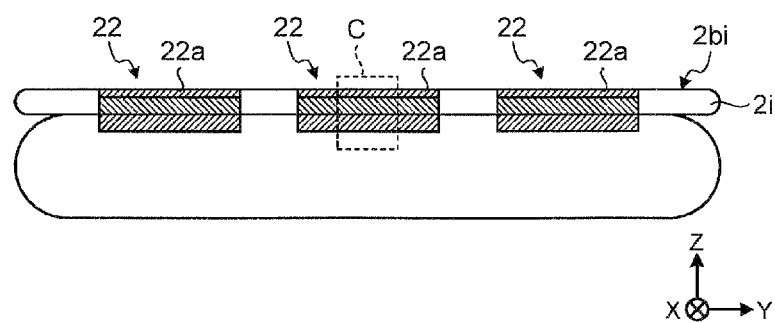

In the step illustrated in FIG. 1C, a rewiring layer 22*a* is formed in each chip region 22 on the back surface 2*bi* of the substrate 2*i*. The rewiring layer 22*a* may be selectively formed in the region where each chip region 22 is disposed. The rewiring layer 22*a* includes an electrode, an inorganic insulating film, and a predetermined wiring pattern. The predetermined wiring pattern includes a wiring pattern of a circuit that selects the chip region 22.

Figure 2D:
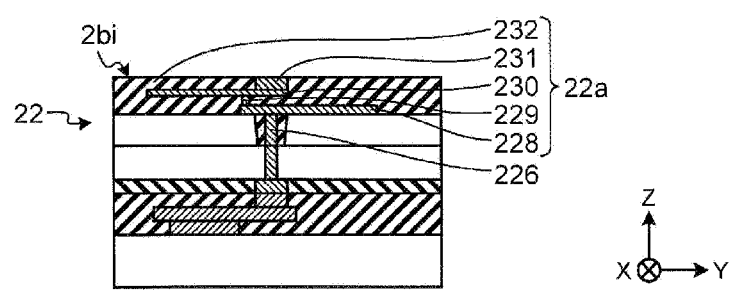

For example, as illustrated in FIG. 2D, a conductive film 228, a conductor 229, a conductive film 230, and an electrode 231 are deposited in this order, and an inorganic insulating film 232 is formed to fill the peripheries thereof. As a result, the rewiring layer 22*a* is formed including the conductive film 228, the conductor 229, the conductive film 230, the electrode 231, and the inorganic insulating film 232. The −Z-side surface of the conductive film 228 is in contact with the through via 226, and the +Z-side surface of the conductive film 228 is in contact with the conductor 229. The −Z-side surface of the conductive film 231 is in contact with the conductor 229, and the +Z-side surface of the conductive film 231 is in contact with the electrode 231. The +Z-side surface of the electrode 231 is exposed to form a portion of the back surface 2*bi*, and the +Z-side surface of the inorganic insulating film 232 is exposed to form another portion of the back surface 2*bi*. The electrode 231 may be formed of a material that contains metal such as copper as a main component. The inorganic insulating film 232 may be formed of a material that contains silicon oxide and/or silicon nitride as a main component.

Figure 3A:
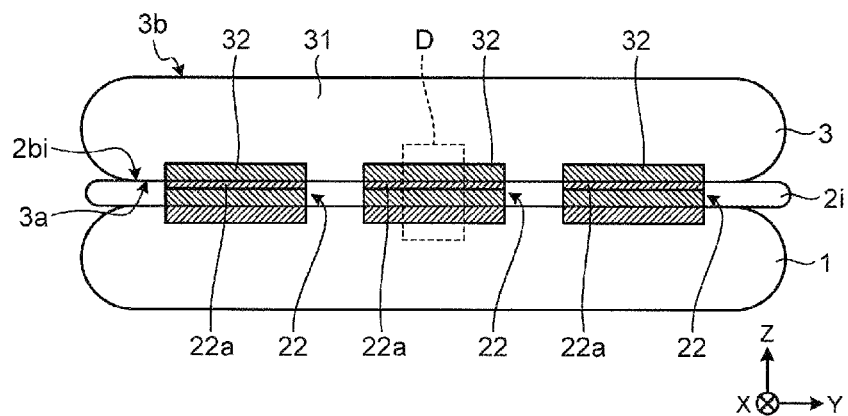
FIGS. 3A to 3C are cross-sectional views illustrating the semiconductor device manufacturing method according to the first embodiment.

In the step illustrated FIG. 3A, a substrate 3 is prepared. The substrate 3 has a substantially disk shape, and has a substantially circular shape in the XY plan view. The substrate 3 may be formed of a material that contains a semiconductor (e.g., silicon) as a main component.

A plurality of chip regions 32 is formed on the front surface 3*a* of the substrate 3. Each chip region 32 is disposed on abase region 31. The base region 31 is formed of a material that contains a semiconductor (e.g., silicon) as a main component. In the chip region 32, for example, a conductive pattern and an interlayer insulating film that fills the periphery thereof are formed as a device pattern. In addition, a memory device including a memory cell array and peripheral circuits can be formed.

Figure 4A:
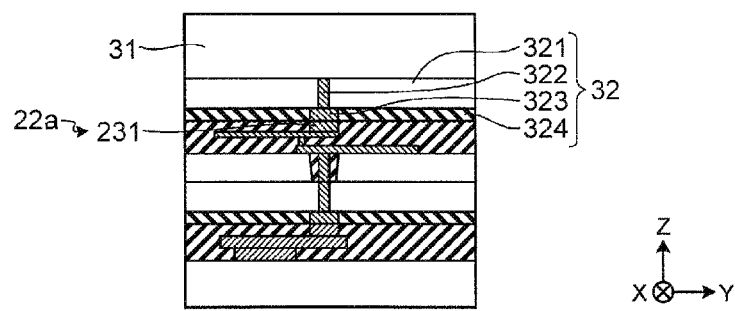
FIGS. 4A to 4D are enlarged cross-sectional views illustrating the semiconductor device manufacturing method according to the first embodiment.

For example, as illustrated in FIG. 4A, in the chip region 32, a device structure 321 is formed in the base region 31 and/or on the −Z side of the base region 31. A through via hole is formed in the device structure 321, and a conductive material is embedded in the through via hole, so as to form a through via 322. An inorganic insulating film is deposited on the front surface of the device structure 321, an opening is formed therein, and a conductive material is embedded in the opening, so as to form an electrode 323 and an inorganic insulating film 324. The +Z-side surface of the electrode 323 is in contact with the predetermined conductive pattern in the device structure 321, so as to be electrically connected to the predetermined conductive pattern. The −Z-side surface of the electrode 323 is exposed to form a portion of the front surface 3a, and the −Z-side surface of the inorganic insulating film 324 is exposed to form another portion of the front surface 3a. The electrode 323 may be formed of a material that contains a metal such as copper as a main component. The inorganic insulating film 324 may be formed of a material that contains silicon oxide and/or silicon nitride as a main component.

As illustrated in FIG. 3A, the front surface 3a of the substrate 3 is bonded to the back surface 2bi of the substrate 2i. For example, the back surface 2bi of the substrate 2i and the front surface 3a of the substrate 3 face each other in the Z direction, and the XY position of the substrate 2i and the XY position of the substrate 3 are adjusted such that the XY position of the chip region 22 or the rewiring layer 22a and the XY position of the chip region 32 are aligned. The substrates 2i and 3 are relatively close to each other in the Z direction so as to be bonded to each other.

The front surface 3a of the substrate 3 may be bonded to the back surface 2bi of the substrate 2i through a direct bonding. For example, the back surface 2bi of the substrate 2i and the front surface 3a of the substrate 3 are each activated by plasma, and the substrate 2i comes into close contact with the substrate 3, so that the substrate 2i is temporarily bonded to the substrate 3. Then, the substrate 3 is heated to be finally bonded to the substrate 2i. When the direct bonding is performed, the gap between the bonding surfaces may be reduced, as compared with a case where an adhesive layer such as a bump electrode or a DAF is interposed. That is, the distance between the back surfaces 2bi and the front surface 3a in the Z direction may be reduced.

Figure 3B:
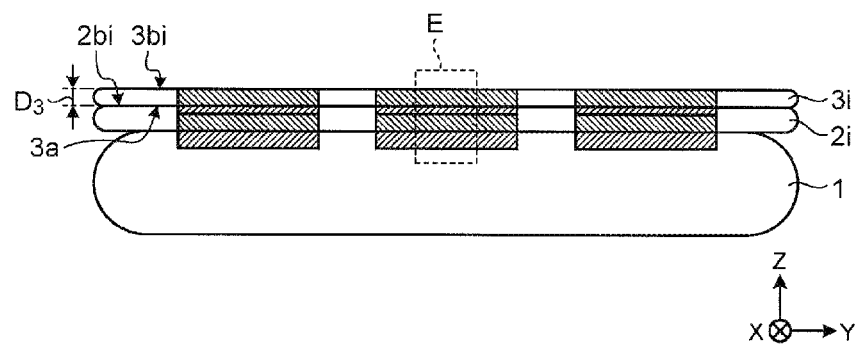

In the step illustrated in FIG. 3B, the back surface 3b of the substrate 3 is thinned in a state where the front surface 3a is bonded to the back surface 2bi of the substrate 2i. For example, a grinder which is a polishing device is pressed against the back surface 3b of the substrate 3 and rotates about an axis perpendicular to the contact surface, and the rotation of the grinder is continued until the thickness of a substrate 3i reaches a desired thickness D3. At this time, since the front surface 3a is bonded to the back surface 2bi of the substrate 2i, the back surface 3bi may be stably polished while the substrate 3 is supported flatly by the substrate 1 via the substrate 2i. Further, since the substrate 3 is supported flatly by the substrate 1 via the substrate 2i, the desired thickness D3 may be made as thin as possible.

Figure 4B:
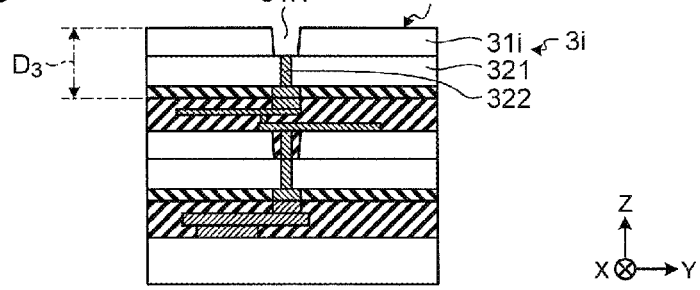

For example, as illustrated in FIG. 4B, a base region 31i may be thinned to a thickness of a lower limit that may ensure the reliability of the device structure 321. At this time, the substrate 3i may be completely removed. As a result, the thickness of the substrate 3i may be thinned to the desired thickness D3. After the substrate 3i is thinned, a through via hole 31i1 is formed in the substrate 3i. The through via hole 31i1 penetrates the base region 31i from the back surface 3bi in the Z direction, and reaches the +Z-side surface of the through via 322, to expose the +Z-side surface of the through via 322.

Figure 4C:
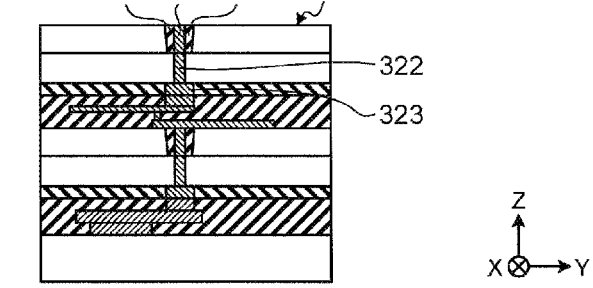

Then, as illustrated in FIG. 4C, an insulating film 325 is deposited on the side surface and the bottom surface of the through via hole 31i1 by the CVD method or the like. A portion of the bottom surface of the deposited insulating film 325 is selectively removed by the RIE method or the like, to expose the +Z-side surface of the through via 322 again. Then, a conductive material such as copper is embedded in the through via hole 31i1 by a plating method or the like, to form a through via 326. The −Z-side end of the through via 326 is in contact with the +Z-side surface of the through via 322, to be electrically connected to the electrode 323 via the through via 322.

When an adhesive layer is used for bonding the substrate 3 and the substrate 2 to each other, the substrate 3i and the substrate 2 may be heated to a temperature at which a high-quality insulating film may be formed in depositing the insulating film on the side surface and the bottom surface of the through via hole 31i1. At this time, the adhesive layer may be melted, which deteriorates the flatness of the bonding interface, or the adhesive layer may be evaporated due to a carbonization, which deteriorates the adhesiveness of the bonding interface.

Meanwhile, in at least one embodiment, for example, the direct bonding is performed for bonding the substrate 3 and the substrate 2 to each other without using the adhesive layer. Thus, the problem described above may be avoided, so that the substrate 3i and the substrate 2 may be heated to the temperature at which the high-quality insulating film is formable. As a result, the high-quality insulating film 325 may be deposited on the side surface of the through via hole 31i1.

Figure 3C:
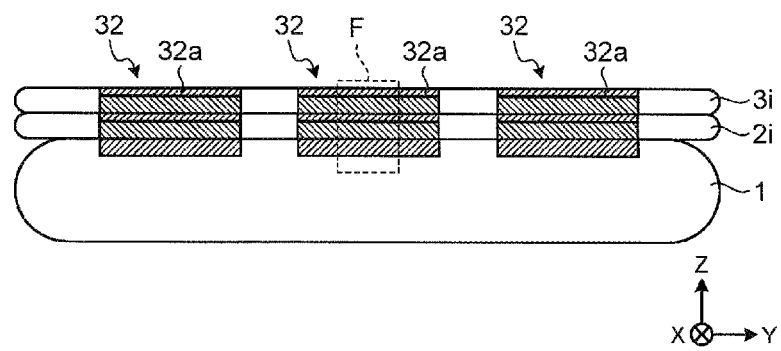

In the step illustrated in FIG. 3C, a rewiring layer 32a is formed in each chip region 32 of the back surface 3bi of the substrate 3i. The rewiring layer 32a may be selectively formed in the region where the chip region 32 is disposed. The rewiring layer 32a includes an electrode, an inorganic insulating film, and a predetermined wiring pattern. The predetermined wiring pattern includes a wiring pattern of a circuit that selects the chip region 32.

Figure 4D:
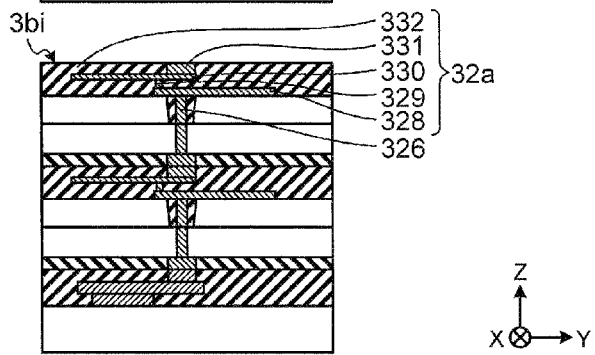

For example, as illustrated in FIG. 4D, a conductive film 328, a conductor 329, a conductive film 330, and an electrode 331 are deposited in this order, and an inorganic insulating film 332 is formed to fill the peripheries thereof. As a result, the rewiring layer 32a is formed including the conductive film 328, the conductor 329, the conductive film 330, the electrode 331, and the inorganic insulating film 332. The −Z-side surface of the conductive film 328 is in contact with the through via 326, and the +Z-side surface of the conductive film 328 is in contact with the conductor 329. The −Z-side surface of the conductive film 330 is in contact with the conductor 329, and the +Z-side surface of the conductive film 330 is in contact with the electrode 331. The +Z-side surface of the electrode 331 is exposed to form a portion of the back surface 3bi, and the +Z-side surface of the inorganic insulating film 332 is exposed to form another portion of the back surface 3bi. The electrode 331 may be formed of a material that contains a metal such as copper as a main component. The inorganic insulating film 332 may be formed of a material that contains silicon oxide and/or silicon nitride as a main component.

Figure 5A:
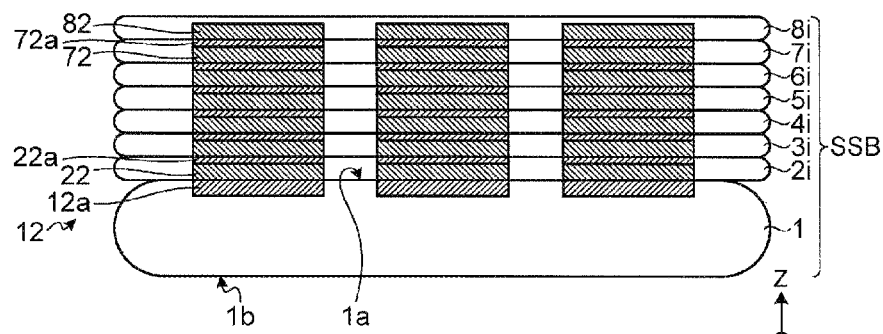
FIGS. 5A to 5C are cross-sectional views illustrating the semiconductor device manufacturing method according to the first embodiment.

In the step illustrated in FIG. 5A, the same processes as performed in the steps illustrated in FIGS. 3A to 3C are performed for each of substrates 4 to 7, and the same processes as performed in the steps illustrated in FIGS. 3A and 3B are performed for a substrate 8. Each of the substrates 4 to 8 has a substantially disk shape, and has a substantially circular shape in the XY plan view. Each of the substrates 4 to 8 may be formed of a material that contains a semiconductor (e.g., silicon) as a main component. The back surface 8bi of the substrate 8 may be brought into the state of FIG. 4A in which neither a rewiring layer nor a through via is formed. However, the back surface 8bi of the substrate 8 may be brought into any state in which even a rewriting layer may be formed, that is, any of the states of FIGS. 4A to 4D. As a result, as illustrated in FIG. 5A, a stacked substrate SSB is obtained in which individually thinned substrates 2i to 8i are stacked in an order on the front surface 1a of the substrate 1.

In the stacked substrate SSB, the substrate 1 includes a plurality of chip regions 12. Each chip region 12 includes a rewiring layer 12a. The substrate 2i includes a plurality of chip regions 22. Each chip region includes a rewiring layer 22a on the +Z side. The substrate 7i includes a plurality of chip regions 72. Each chip region 72 includes a rewiring layer 72a on the +Z side. The substrate 8i includes a plurality of chip regions 82. Each chip region 82 includes no rewiring layer. The chip regions 12, 22, . . . , 72, and 82 of the respective substrates 1, 2i, . . . , 7i, and 8i correspond to each other. The corresponding chip regions 12, 22, . . . , 72, and 82 of the respective substrates 1, 2, . . . , 7i, and 8i have substantially identical XY positions, and are stacked in the Z direction. The rewiring layers 22a to 72a include wiring patterns of circuits that select the chip regions 22 to 72, respectively.

Figure 5B:
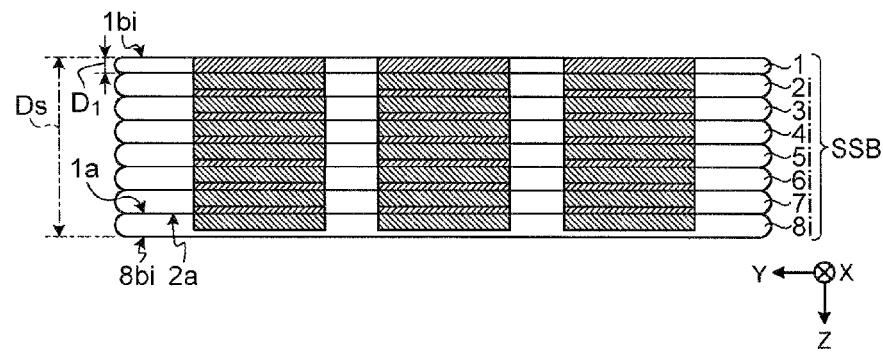

In the step illustrated in FIG. 5B, the back surface 1b of the substrate 1 is thinned. For example, in the stacked substrate SSB, the +Z side and the −Z side are inverted upside down, and a grinder which is a polishing device is pressed against the back surface 1b of the substrate 1. The grinder rotates about an axis perpendicular to the contact surface, and the rotation of the grinder is continued until the thickness of the substrate 1i reaches the desired thickness D1. The substrate 1 may be thinned until the −Z-side surface of the electrode 121 of the rewiring layer 12a is exposed (see FIG. 2A). At this time, since the front surface 1a is bonded to the front surface 2a of the substrate 2i, the back surface 1bi may be stably polished while the substrate 1 is supported flatly by the other substrates 2i to 8i of the stacked substrate SSB. Further, since the substrate 1 is supported flatly by the other substrates 2i to 8i of the stacked substrate SSB, the thickness D1 of the substrate 1i may be made as thin as possible. That is, since each of the substrates 1i to 8i in the stacked substrate SSB may be made as thin as possible, the number of substrates in the stacked substrate SSB may be increased (eight substrates in FIG. 5B) while making the thickness Ds of the stacked substrate SSB fall within a desired thickness range. Further, a wiring layer may be further formed after the surface of the electrode 12 of the rewiring layer 12a on the −Z side is exposed.

Figure 5C:
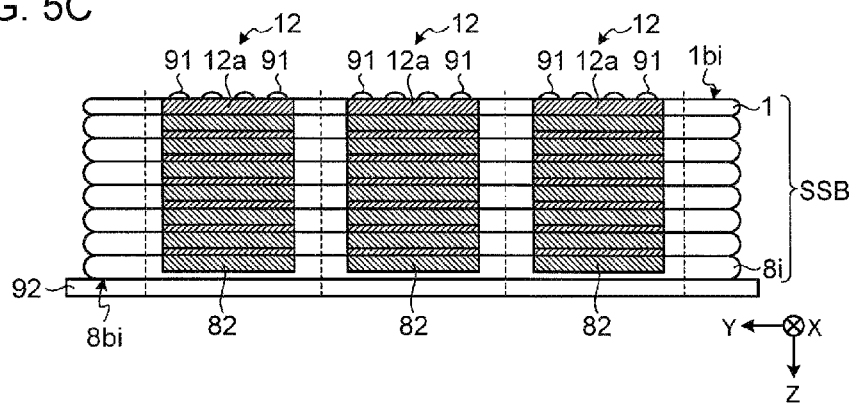

In the step illustrated in FIG. 5C, ball electrodes 91 are formed in each chip region 12 of the back surface 1bi of the substrate 1i. Each ball electrode 91 may be formed of a conductive material such as solder. The ball electrodes 91 are formed to be electrically connected to the electrode 121 of the rewiring layer 12a (see FIG. 2A).

A dicing tape 92 is adhered to the +Z-side surface 8bi of the stacked substrate SSB, so that target positions of a dicing process are determined as indicated by dashed lines in FIG. 5C. As the target positions of the dicing process, positions that do not overlap with chip groups CG that each include the chip regions 12 to 82 arranged in the Z direction are selected. The target positions of the dicing process may be grid-like lines that partition the matrix-like arrangement of the plurality of chip groups CG that each include the chip regions 12 to 82 arranged in the Z direction.

Figure 6A:
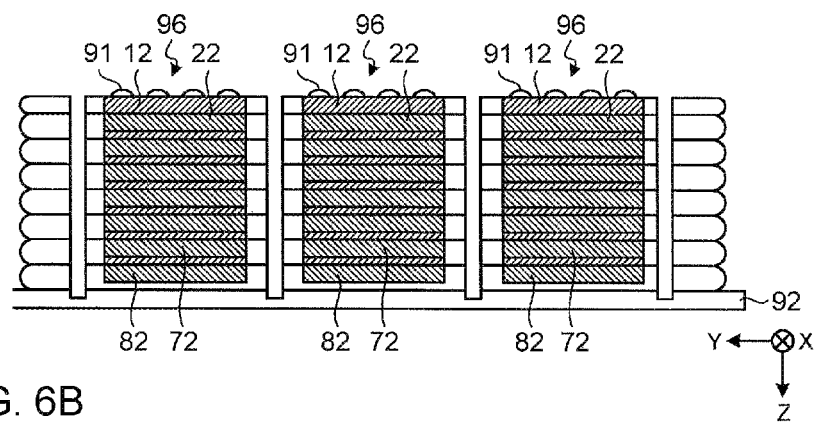
FIGS. 6A to 6C are cross-sectional views illustrating the semiconductor device manufacturing method according to the first embodiment.

In the step illustrated in FIG. 6A, the dicing process is performed along the target positions to reach the dicing tape 92. As a result, the stacked substrate SSB is cut in the Z direction among the plurality of chip regions and separated into a plurality of stacked bodies 96. In each stacked body 96, the plurality of chip regions 12 to 82 that each have been thinned are stacked. As a result, the number of chips mounted in the stacked body 96 may be increased. For example, when each of the chip regions 12 to 82 is a memory chip region, a large memory capacity of the stacked body 96 may be secured.

In each stacked body 96, the chip regions 12 to 82 are stacked in an order in the Z direction, and the ball electrodes 91 are arranged on the −Z-side surface of the stacked body 96. In each stacked body 96, a chip region of an access destination is switchable in the circuits that select the chip regions 22 to 72, according to a signal supplied from the outside through the ball electrodes 91. While each stacked body 96 may operate in this state, unnecessary charges may be generated at the PN bonding portion, when light enters from the outside.

Figure 6B:
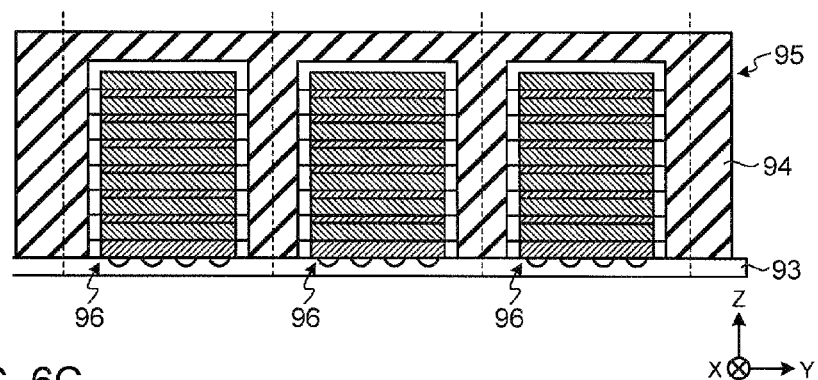

Meanwhile, in the step illustrated in FIG. 6B, the back surfaces and the side surfaces of the plurality of separated stacked bodies 96 are covered with an insulator 94 to form a sealing body 95. The insulator 94 is formed of a material that contains an insulating material as a main component, and may be formed of a material that contains a resin with a light-shading property, an insulating property, and a thermoplasticity as a main component. For example, the +Z-side surfaces of the plurality of separated stacked bodies 96 are detached from the dicing tape 92. The plurality of stacked bodies 96 are arranged on the dicing tape 93, while the +Z side and the −Z side are inverted upside down such that the −Z-side surface of each of the stacked bodies 96 is adhered to the dicing tape 93. The plurality of stacked bodies 96 are arranged at intervals equal to or larger than the width of the dicing blade. The plurality of stacked bodies 96 may be arranged in a matrix form on the dicing tape 93 in the XY plan view.

For the sealing body 95, the target positions of the dicing process are determined as indicated by dashed lines. As the target positions of the dicing process, positions that do not overlap with the stacked bodies 96 are selected. The target positions of the dicing process may be grid-like lines that partition the matrix-like arrangement of the plurality of stacked bodies 96.

Figure 6C:
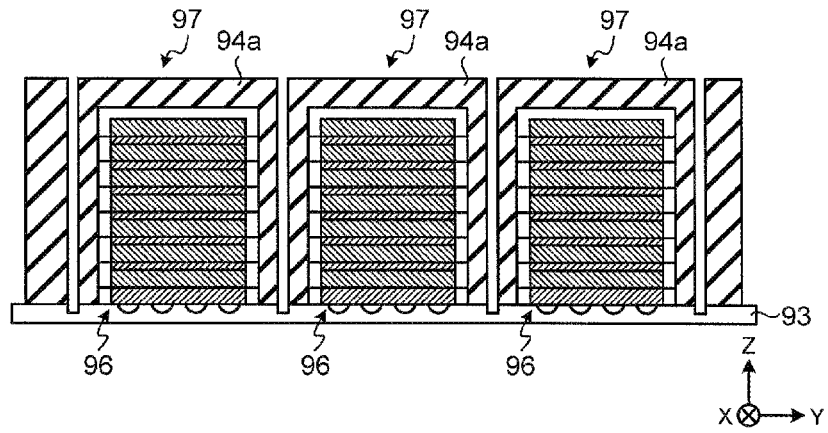

In the step illustrated in FIG. 6C, the dicing process is performed along the target positions to reach the dicing tape 93. As a result, the sealing body 95 is cut in the Z direction among the plurality of stacked bodies 96, and separated into a plurality of packages of semiconductor devices 97. Each semiconductor device 97 is obtained as a single stacked package by being detached from the dicing tape 93. In each semiconductor device 97, the +Z-side surface, the +X-side surface, the −X-side surface, the +Y-side surface, and the −Y-side surface of the stacked body 96 are covered with a light-shading insulator 94a. As a result, in the semiconductor device 97, the generation of unnecessary charges due to the external light may be prevented.

As described above, in the first embodiment, the stacked substrate SSB is formed by repeating the bonding and the thinning of the substrates multiple times. At this time, when the substrates are bonded through the direct bonding, the number of substrates stacked at a predetermined height may be increased. Further, the stacked substrate SSB is cut in the stacking direction among the chip regions, and separated into the plurality of stacked bodies 96. The packages of the semiconductor devices 97 are formed using the separated stacked bodies 96. As a result, the number of chips mounted in the package of each semiconductor device 97 may be increased, so that the mounting density of the semiconductor device 97 may be easily improved.

Second Embodiment

Next, a semiconductor device manufacturing method according to a second embodiment will be described. Hereinafter, descriptions will be made focusing on differences from the first embodiment.

The first embodiment describes the method of forming the ball electrodes on the stacked bodies before the stacked bodies are sealed with the insulator. Meanwhile, a second embodiment describes a method of forming the ball electrodes on the stacked bodies after the stacked bodies are sealed with the insulator.

Specifically, after the steps illustrated in FIGS. 1A to 5B are performed, the ball electrodes 91 are not formed, and the dicing tape 92 is adhered to the +Z-side surface 8bi of the stacked substrate SSB, so that the target positions of the dicing process are determined as indicated by dashed lines in FIG. 5C. As the target positions of the dicing process, positions that do not overlap with the chip groups CG that each include the chip regions 12 to 82 arranged in the Z direction are selected. The target positions of the dicing process may be grid-like lines that partition the matrix-like arrangement of the plurality of chip groups CG that each include the chip regions 12 to 82 arranged in the Z direction. Then, the steps illustrated in FIGS. 7A to 8B are performed. FIGS. 7A to 8B are cross-sectional views illustrating the semiconductor device manufacturing method.

Figure 7A:
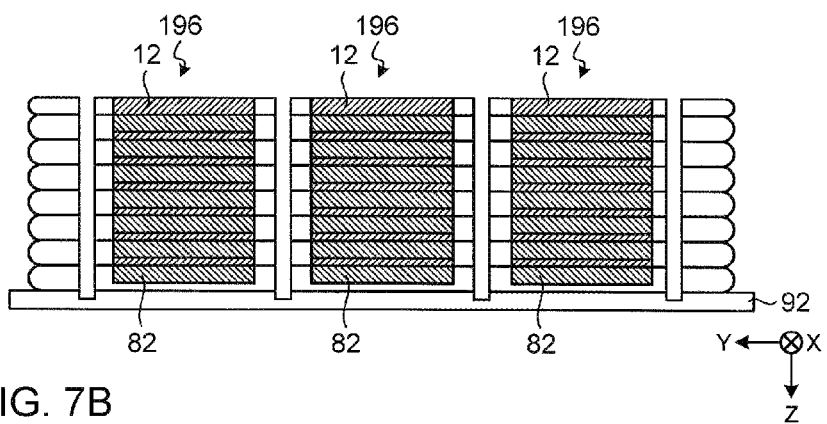
FIGS. 7A and 7B are cross-sectional views illustrating a semiconductor device manufacturing method according to a second embodiment.

In the step illustrated in FIG. 7A, the dicing process is performed along the target positions to reach the dicing tape 92. As a result, the stacked substrate SSB is cut in the Z direction among the plurality of chip regions, and separated into a plurality of stacked bodies 196. Each stacked body 196 is the same as the stacked body 96, except that the ball electrodes 91 are not mounted on the −Z-side surface of the stacked body 196.

Figure 7B:
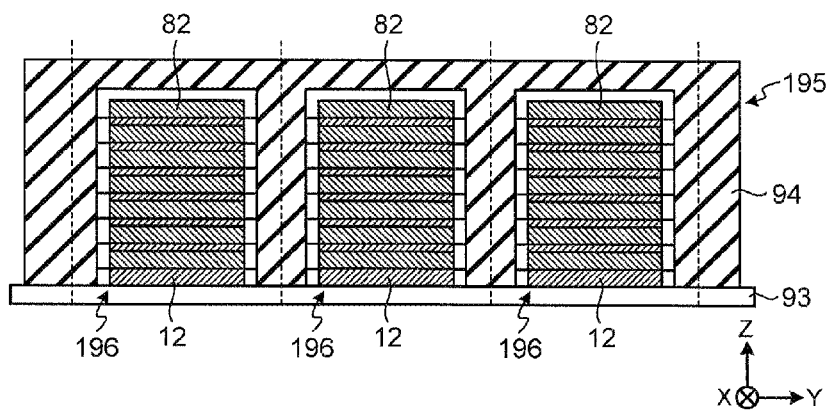

In the step illustrated in FIG. 7B, the back surfaces and the side surfaces of the plurality of separated stacked bodies 196 are covered with an insulator 94 to form a sealing body 195. For example, the +Z-side surfaces of the plurality of separated stacked bodies 196 are detached from the dicing tape 92. The plurality of stacked bodies 196 are arranged on the dicing tape 98, while the +Z side and the −Z side are inverted upside down such that the −Z-side surface of each of the stacked bodies 196 is adhered to the dicing tape 98. The plurality of stacked bodies 196 are arranged at intervals equal to or larger than the width of the dicing blade. The plurality of stacked bodies 196 may be arranged in a matrix form on the dicing tape 98 in the XY plan view. In this state, the insulator 94 is supplied to cover the plurality of stacked bodies 196 so that the sealing body 195 is formed.

Figure 8A:
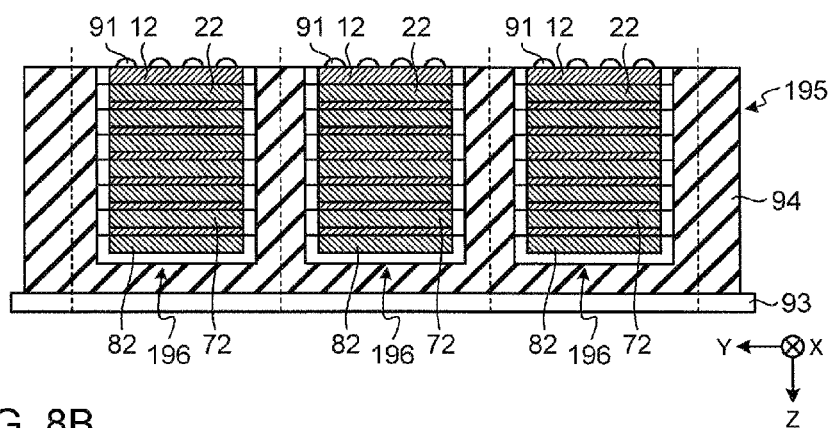
FIGS. 8A and 8B are cross-sectional views illustrating the semiconductor device manufacturing method according to the second embodiment.

In the step illustrated in FIG. 8A, the sealing body 195 is detached from the tape 98, and the +Z side and the −Z side are inverted upside down such that the +Z-side surface of the sealing body 195 is adhered to the dicing tape 93. For the sealing body 195, the target positions of the dicing process are determined as indicated by dashed lines. As the target positions of the dicing process, positions that do not overlap with the stacked bodies 196 are selected. The target positions of the dicing process may be grid-like lines that partition the matrix-like arrangement of the plurality of stacked bodies 196.

The ball electrodes 91 are formed on the +Z-side surface of each of the stacked bodies 196. Each ball electrode 91 may be formed of a conductive material such as solder. The ball electrodes 91 are formed to be electrically connected to the through via of the chip region 82 (see FIG. 4C). The ball electrodes 91 may be formed to be in contact with the +Z-side surface of the through via, or a wiring layer that includes a wiring connected to the through via may be formed on the through via such that the ball electrodes 91 come into contact with the wiring. In each stacked body 196, a chip region of an access destination is switchable in the circuits that select the chip regions 22 to 72 according to a signal supplied from the outside through the ball electrodes 91.

Figure 8B:
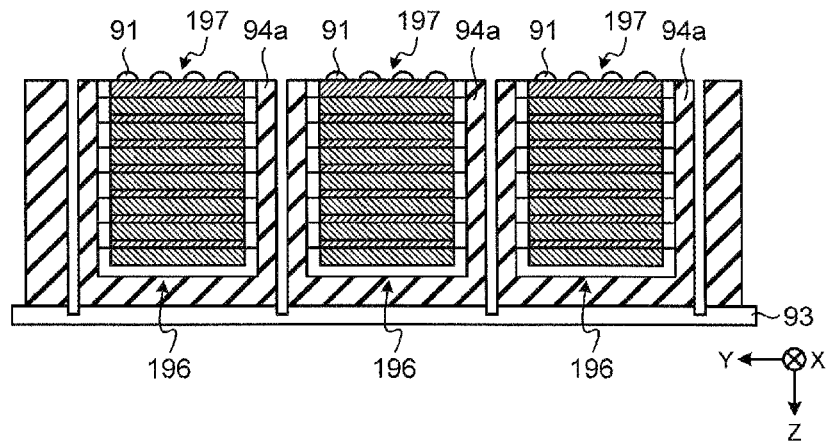

In the step illustrated in FIG. 8B, the dicing process is performed along the target positions to reach the dicing tape 93. As a result, the sealing body 195 is cut in the Z direction among the plurality of stacked bodies 196, and separated into a plurality of packages of semiconductor devices 197. In each semiconductor device 197, the +Z-side surface, the +X-side surface, the −X-side surface, the +Y-side surface, and the −Y-side surface of the stacked body 196 are covered with an insulator 94a having a light shading property. As a result, in the semiconductor device 197, the generation of unnecessary charges due to the external light may be prevented.

As described above, in the second embodiment, the ball electrodes 91 are formed on the stacked bodies 196 after the stacked bodies 196 are sealed with the insulator 94. In this method as well, the packages of the semiconductor devices 197 may be formed using the stacked bodies 196.

Third Embodiment

Next, a semiconductor device manufacturing method according to a third embodiment will be described. Hereinafter, descriptions will be made focusing on differences from the first and second embodiments.

The third embodiment describes a method of covering the side surfaces and the back surfaces of the separated stacked bodies with a conductive film, so as to construct packages of semiconductor devices that each include a light-shading film which also serves as a shielding film.

Figure 9A:
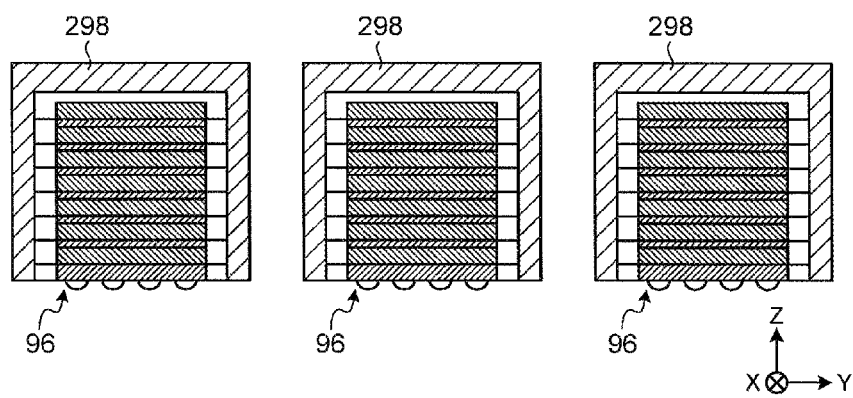
FIGS. 9A and 9B are cross-sectional views illustrating a semiconductor device manufacturing method according to a third embodiment.
Figure 9B:
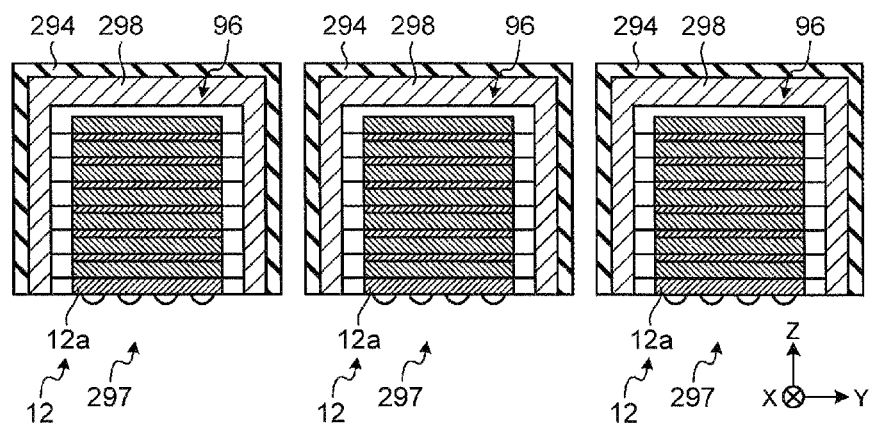

Specifically, after the steps illustrated in FIGS. 1A to 6A are performed, the +Z-side surfaces of the plurality of separated stacked bodies 96 are detached from the dicing tape 92. The plurality of stacked bodies 96 are arranged on a stage or an electrode of a film forming apparatus (not illustrated), while the +Z side and the −Z side are inverted upside down such that the −Z-side surface of each of the stacked bodies 96 faces the stage or electrode. The plurality of stacked bodies 96 are arranged at intervals equal to or larger than the interval that may ensure the film formation on the side surfaces of the stacked bodies 96. The plurality of stacked bodies 96 may be arranged in a matrix form in the XY plan view on the stage or electrode. Then, the steps illustrated in FIGS. 9A and 9B are performed. FIGS. 9A and 9B are cross-sectional views illustrating the semiconductor device manufacturing method.

In the step illustrated in FIG. 9A, a conductive film 298 is deposited to cover the side surfaces and the bottom surface of each stacked body 96 by a CVD method, a plating method or the like. The conductive film 298 may be formed of a material that contains a metal such as aluminum or copper as a main component.

In the step illustrated in FIG. 9B, an insulating film 294 is deposited on the external side of the conductive film 298, to cover the side surfaces and the bottom surface of each stacked body 96 by a CVD method or the like. The insulating film 294 may be formed of an insulating material such as silicon oxide. As a result, a package of a semiconductor device 297 in which the side surface and the bottom surface of the stacked body 96 are covered with the conductive film 298 and the insulating film 294 is obtained. At this time, the insulating film 294 may not be formed.

In the package of the semiconductor device 297, the +Z-side surface, the +X-side surface, the −X-side surface, the +Y-side surface, and the −Y-side surface of the stacked body 96 are covered with the conductive film 298. Since the conductive film 298 may be formed of a material that contains a metal as a main component, the conductive film 298 has the light-shading property. As a result, in the semiconductor device 297, the stacked body 96 may be shaded from light, so that the generation of unnecessary charges due to external light may be prevented.

Further, the rewiring layer 12a of the chip region 12 may include a wiring for electrically connecting the conductive film 298 to the ball electrodes 91 for a ground potential. Since the conductive film 298 may be formed of a material that contains a metal as a main component, the electric potential of the conductive film 298 may be set to the ground potential by being electrically connected to the ball electrodes 91 for the ground potential. As a result, since the conductive film 298 may function as a shield film that shields electromagnetic waves for the stacked body 96, the emission of electromagnetic waves to the outside in the semiconductor device 297 may be prevented, and the intrusion of electromagnetic waves from the outside may be prevented.

As described above, in the third embodiment, the side surfaces and the back surfaces of the separated stacked bodies 96 are covered with the conductive film 298. As a result, the packages of the semiconductor devices 297 that each include a light-shading film which also serves as a shielding film may be provided.

Fourth Embodiment

Next, a semiconductor device manufacturing method according to a fourth embodiment will be described. Hereinafter, descriptions will be made focusing on differences from the first to third embodiments.

The fourth embodiment describes a method of manufacturing a package in which a small-sized chip coexists on a stacked body including a plurality of chips.

When each chip in the stacked body is a memory chip, the small-sized chip may be a controller chip. While the memory chip is formed in a relatively large size in order to secure the memory capacity, the controller chip may be formed in a size smaller than the memory chip because the controller chip is provided with a logic circuit that controls the memory chip.

Specifically, after the steps illustrated in FIGS. 1A to 5A are performed, the steps illustrated in FIGS. 10A to 12B are performed. FIGS. 10A to 12B are cross-sectional views illustrating the semiconductor device manufacturing method.

Figure 10A:
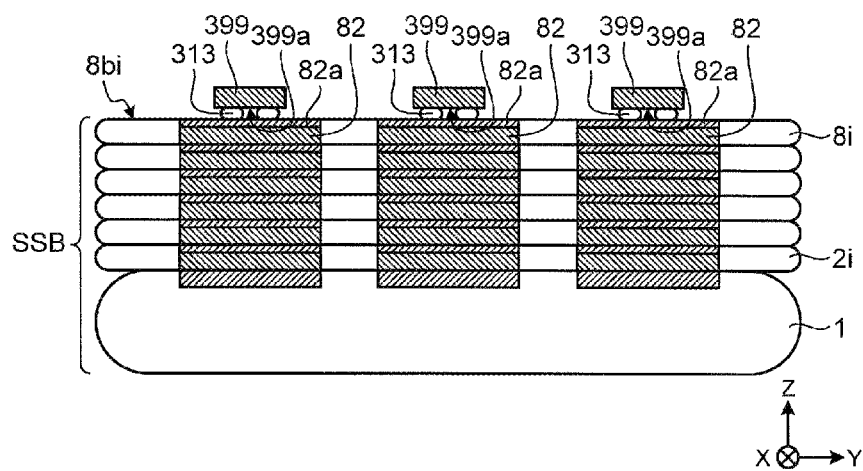
FIGS. 10A and 10B are cross-sectional views illustrating a semiconductor device manufacturing method according to a fourth embodiment.

In the step illustrated in FIG. 10A, ball electrodes 313 are formed in a region where a small-sized chip needs to be disposed, in each chip region 82 of the back surface 8bi of the substrate 8i on the +Z side in the stacked substrate SSB. The ball electrodes 313 may be formed of a conductive material such as solder. The ball electrodes 313 are formed to be electrically connected to an electrode of a rewiring layer 82a (e.g., the same electrode as the electrode 331 of FIG. 4D).

Meanwhile, a plurality of chip regions which becomes small-sized chips, respectively, is formed on a substrate (not illustrated), and the substrate is adhered to a dicing tape and cut among the plurality of chip regions, thereby being separated into a plurality of small-sized chips 399. The electrodes are arranged on the front surface 399a of each of the separated chips 399.

The plurality of chips 399 are mounted on the plurality of chip regions 82 of the substrate 8i via the ball electrodes 313. At this time, the back surface 8bi is in the state where the through via is exposed as illustrated in FIG. 4C, or a rewiring layer is formed as illustrated in FIG. 4D. Each chip 399 is disposed such that in a state where the chip 399 faces downward, the electrode of the front surface 399a is in contact with the ball electrodes 313, so as to be bonded to the ball electrodes 313. The ball electrodes 313 are bonded to the through via exposed in the back surface 8bi or the electrode formed in the rewiring layer.

Figure 10B:
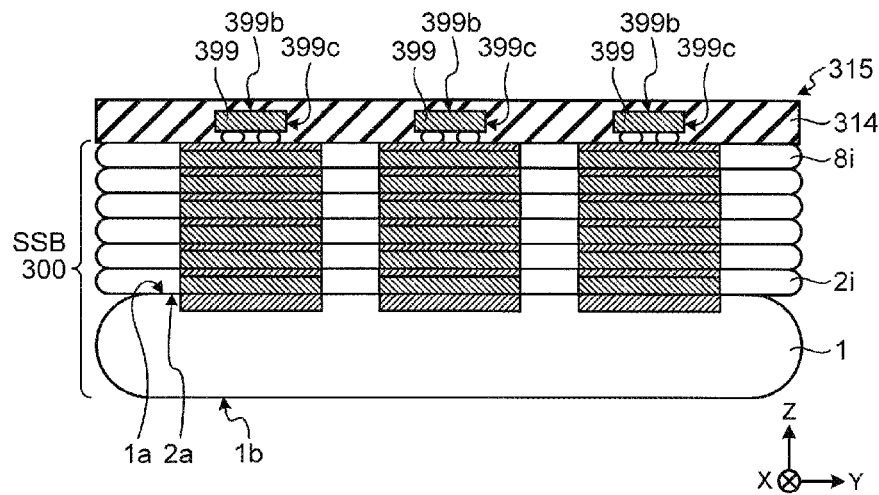

In the step illustrated in FIG. 10B, the back surface 399b and the side surface 399c of each of the plurality of chips 399 are covered with an insulator 314 to form a sealing body 315. The insulator 314 is formed of a material that contains an insulating material as a main component, and may be formed of a material that contains a resin with a light-shading property, an insulating property, and a thermoplasticity as a main component. The sealing body 314 is formed in the same planar shape and planar dimension as those of each of the substrates 1, and 2i to 8i, and is provided as a pseudo substrate. The sealing body 314 has a substantially disk shape, and has a substantially circular shape in the XY plan view. As a result, a stacked substrate SSB300 is obtained in which the sealing body 314 is stacked as a pseudo substrate on the +Z-side of the stacked substrate SSB. The chip 399 may be an interface chip that controls the memory chip.

Figure 11A:
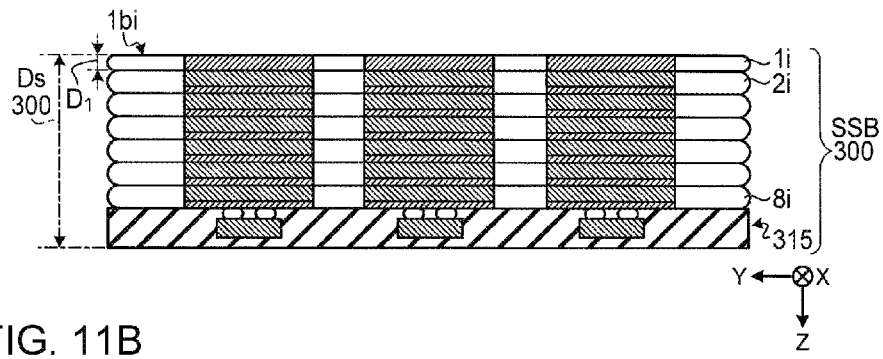
FIGS. 11A to 11C are cross-sectional views illustrating the semiconductor device manufacturing method according to the fourth embodiment.

In the step illustrated in FIG. 11A, the back surface 1b of the substrate 1 is thinned as in the step illustrated in FIG. 5B. For example, in the stacked substrate SSB300, the +Z side and the −Z side are inverted upside down, and a grinder which is a polishing device is pressed against the back surface 1b of the substrate 1. The back surface 1bi of the substrate 1i is polished and thinned. As a result, each of the substrates 1i to 8i in the stacked substrate SSB300 may be made as thin as possible, so that the number of substrates in the stacked substrate SSB300 may be increased, while making the thickness Ds300 of the stacked substrate SSB300 fall within a desired thickness range (eight substrates+one pseudo substrate in FIG. 11A).

Figure 11B:
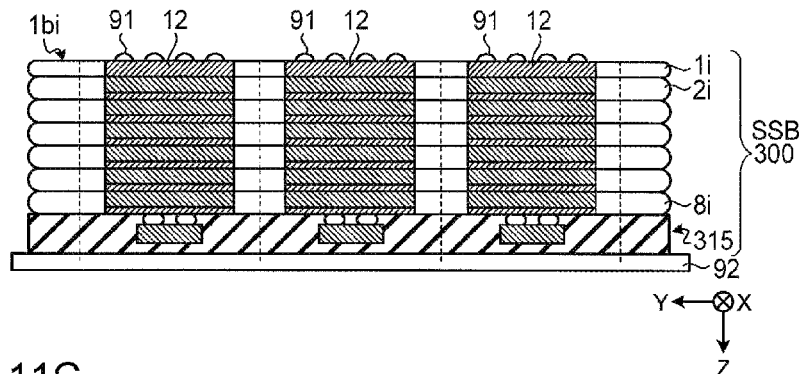

In the step illustrated in FIG. 11B, the ball electrodes 91 are formed in each chip region 12 of the back surface 1bi of the substrate 1i as in the step illustrated in FIG. 5C. Then, the dicing tape 92 is adhered to the +Z-side surface 8bi of the substrate SSB, and the target positions of the dicing process are determined as indicated by dashed lines in FIG. 11B.

Figure 11C:
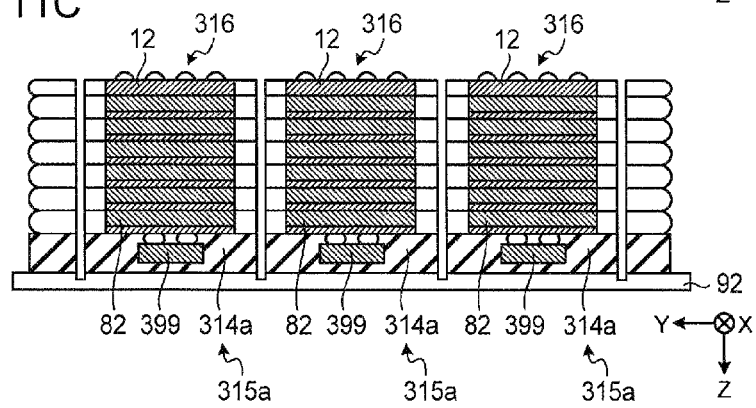

In the step illustrated in FIG. 11C, the dicing process is performed along the target positions to reach the dicing tape 92. As a result, the stacked substrate SSB300 is cut in the Z direction among the plurality of chip regions, and separated into a plurality of stacked bodies 316. In each stacked body 316, the plurality of individually thinned chip regions 12 to 82 and a sealing body 315a are stacked. The sealing body 315a is formed by sealing the back surface and the side surface of the chip 399 with an insulator 314a, and has the same planar shape and planar dimension as those of each of the chip regions 12 to 82. As a result, the number of chips mounted in the stacked body 316 may be increased, and the small-sized chip 399 may coexist. For example, when each of the chip regions 12 to 82 is a memory chip region, the large memory capacity of the stacked body 316 may be secured.

Figure 12A:
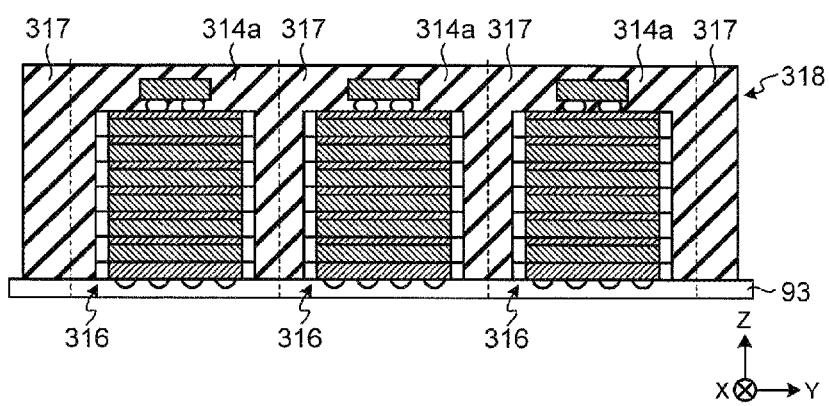
FIGS. 12A and 12B are cross-sectional views illustrating the semiconductor device manufacturing method according to the fourth embodiment.

In the step illustrated in FIG. 12A, the +Z-side surfaces of the plurality of separated stacked bodies 316 are detached from the dicing tape 92. The plurality of stacked bodies 316 are arranged on the dicing tape 93 while the +Z side and the −Z side are inverted upside down such that the −Z-side surface of each of the stacked bodies 316 is adhered to the dicing tape 93. The plurality of stacked bodies 316 are arranged at intervals equal to or larger than the width of the dicing blade. The plurality of stacked bodies 316 may be arranged in a matrix form in the XY plan view on the dicing tape 93.

Then, the side surfaces of the plurality of separated stacked bodies 316 are covered with an insulator 317, or the side surfaces and the +Z-side surfaces of the plurality of separated stacked bodies 316 are covered with the insulator 317, so as to form a sealing body 318. The insulator 317 may be integrated with the insulator 314a of each stacked body 316. The insulator 317 is formed of a material that contains an insulating material as a main component, and may be formed of a material that contains a resin having a light-shading property, an insulating property, and a thermoplasticity as a main component. The material of the insulator 317 may be the same as the material of the insulator 314a.

For the sealing body 318, the target positions of the dicing process are determined as indicated by dashed lines. As the target positions of the dicing process, positions that do not overlap with the stacked bodies 316 are selected. The target positions of the dicing process may be grid-like lines that partition the matrix-like arrangement of the plurality of stacked bodies 316.

Figure 12B:
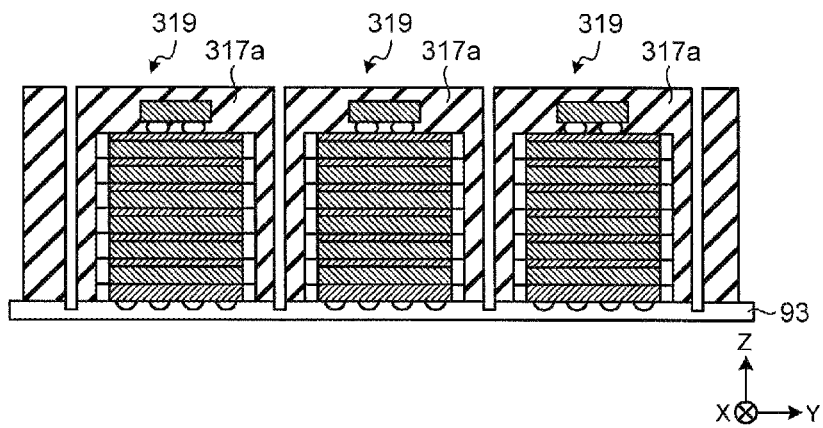

In the step illustrated in FIG. 12B, the dicing process is performed along the target positions to reach the dicing tape 93. As a result, the sealing body 318 is cut in the Z direction among the plurality of stacked bodies 316, and separated into a plurality of packages of semiconductor devices 319. Each semiconductor device 319 is obtained as a single stacked package by being detached from the dicing tape 93. In each semiconductor device 319, the +Z-side surface, the +X-side surface, the −X-side surface, the +Y-side surface, and the −Y-side surface of the stacked body 316 are covered with an insulator 317a having a light shading property.

As described above, in the fourth embodiment, small-sized chips are mounted on the stacked substrate SSB and sealed with a resin, to form the stacked substrate SSB300. The stacked substrate SSB300 is cut in the stacking direction among the chip regions, and separated into the plurality of packages of the semiconductor devices 319. As a result, the packages of the semiconductor devices 319 in which the small-sized chips coexist on the stacked bodies may be provided.

Fifth Embodiment

Next, a semiconductor device manufacturing method according to a fifth embodiment will be described.

Hereinafter, descriptions will be made focusing on differences from the first to fourth embodiments.

The fifth embodiment describes another method of manufacturing a package in which a small-sized chip coexists on a stacked body including a plurality of chips.

Specifically, after the steps illustrated in FIGS. 1A to 5A are performed, the steps illustrated in FIGS. 13A to 16B are performed. FIGS. 13A to 16B are cross-sectional views illustrating the semiconductor device manufacturing method.

Figure 13A:
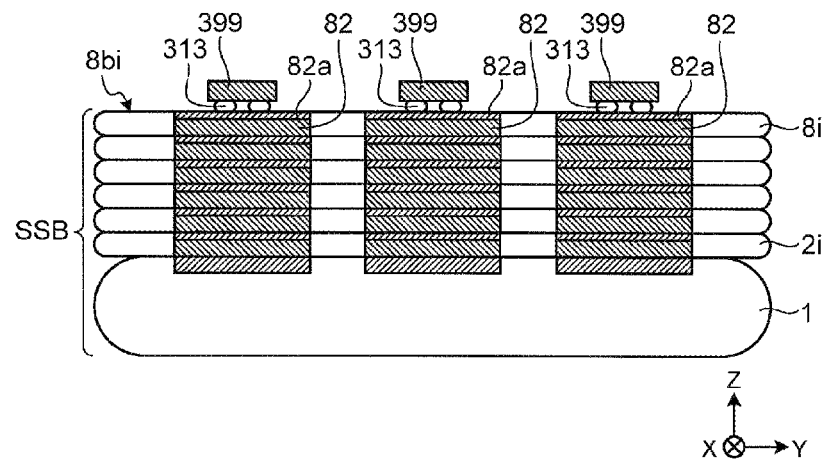
FIGS. 13A and 13B are cross-sectional views illustrating a semiconductor device manufacturing method according to a fifth embodiment.

In the step illustrated in FIG. 13A, the same steps as the steps illustrated in FIG. 10A are performed, so that the plurality of chips 399 are mounted in the plurality of chip regions 82 of the substrate 8i on the +Z side in the stacked substrate SSB via the ball electrodes 313. At this time, the back surface 8bi is in the state where the through via is exposed as illustrated in FIG. 4C, or a rewiring layer is formed as illustrated in FIG. 4D. Each chip 399 is disposed such that in a state where the chip 399 faces downward, the electrode of the front surface 399a is in contact with the ball electrodes 313, so as to be bonded to the ball electrodes 313. The ball electrodes 313 are bonded to the through via exposed in the back surface 8bi or the electrode formed in the rewiring layer.

Figure 13B:
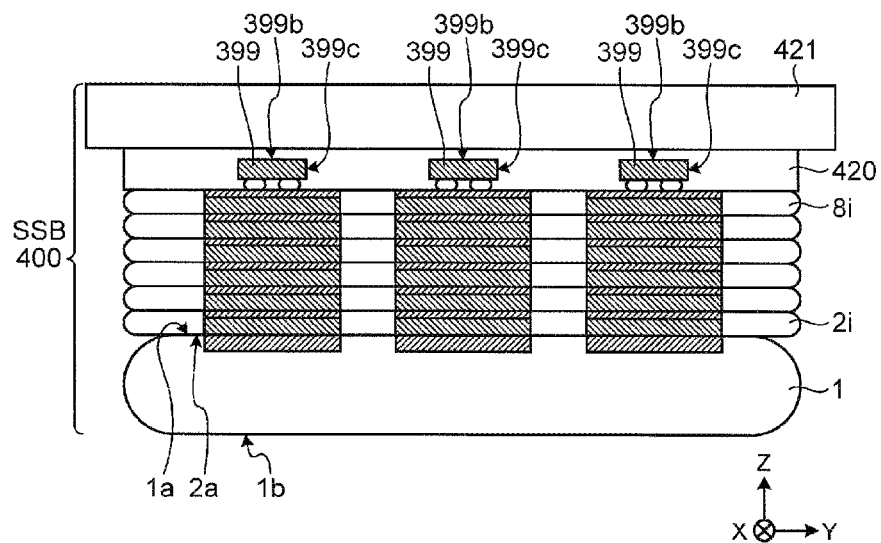

In the step illustrated in FIG. 13B, a support substrate 421 is adhered to the +Z side of the stacked substrate SSB via an adhesive tape 420. At this time, the back surface 399b and the side surface 399c of each of the plurality of chips 399 are covered with the adhesive tape 420. As a result, a stacked substrate SSB400 is obtained in which the support substrate 421 is stacked on the +Z side of the stacked substrate SSB via the adhesive tape 420.

Figure 14A:
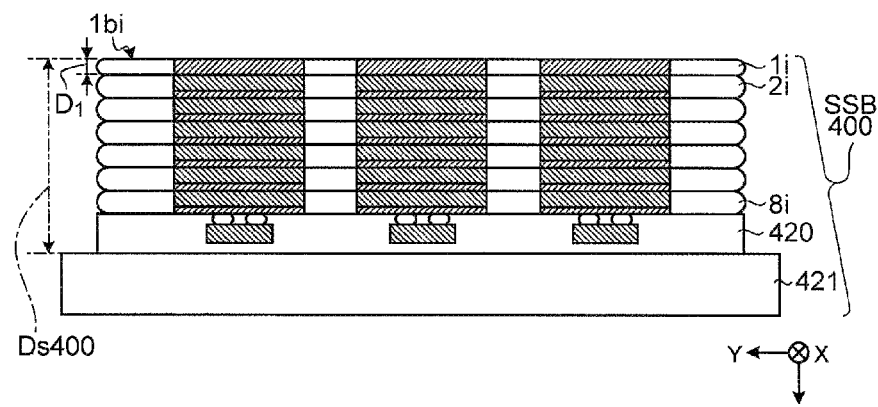
FIGS. 14A and 14B are cross-sectional views illustrating the semiconductor device manufacturing method according to the fifth embodiment.

In the step illustrated in FIG. 14A, the back surface 1b of the substrate 1 is thinned as in the step illustrated in FIG. 5B. For example, in the stacked substrate SSB400, the +Z side and the −Z side are inverted upside down, and a grinder which is a polishing device is pressed against the back surface 1b of the substrate 1. The back surface 1bi of the substrate 1i is polished and thinned. As a result, each of the substrates 1i to 8i in the stacked substrate SSB400 may be made as thin as possible, so that the number of substrates in the stacked substrate SSB400 may be increased (eight substrates+one pseudo substrate in FIG. 14A), while making the thickness Ds400 of the stacked substrate SSB400 fall within a desired thickness range.

Figure 14B:
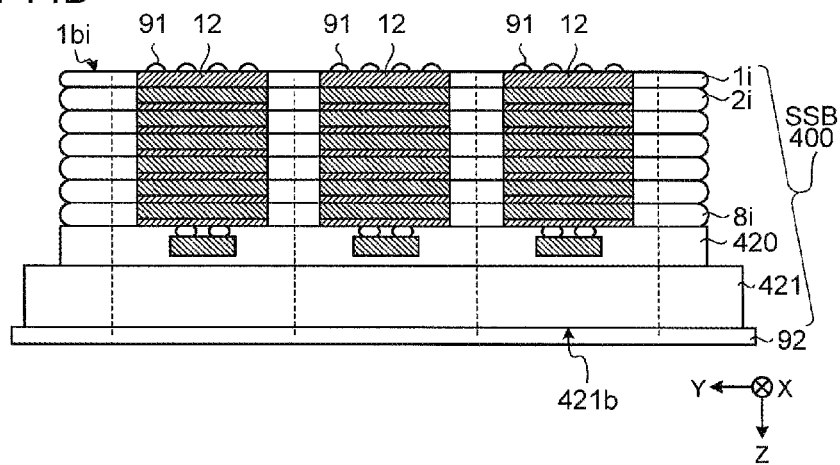

In the step illustrated in FIG. 14B, the ball electrodes 91 are formed in each chip region 12 of the back surface 1bi of the substrate 1i as in the step illustrated in FIG. 5C. Then, the dicing tape 92 is adhered to the +Z-side surface 421b of the stacked substrate SSB400, so that the target positions of the dicing process are determined as indicated by dashed lines in FIG. 14B.

Figure 15A:
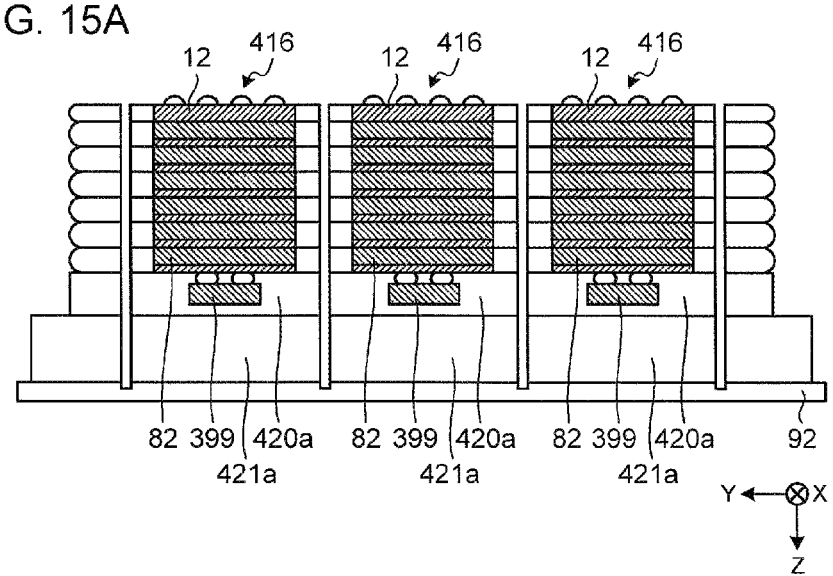
FIGS. 15A and 15B are cross-sectional views illustrating the semiconductor device manufacturing method according to the fifth embodiment.

In the step illustrated in FIG. 15A, the dicing process is performed along the target positions to reach the dicing tape 92. As a result, the stacked substrate SSB400 is cut in the Z direction among the plurality of chip regions, and separated into a plurality of stacked bodies 416. In each stacked body 416, the plurality of individually thinned chip regions 12 to 82 and the chip 399 are stacked, and the +Z side of the stacked body 416 is adhered to a support substrate 421a via an adhesive tape 420a. The adhesive tape 420a and the support substrate 421a have the same planar shape and planar dimension as those of each of the chip regions 12 to 82.

Figure 15B:
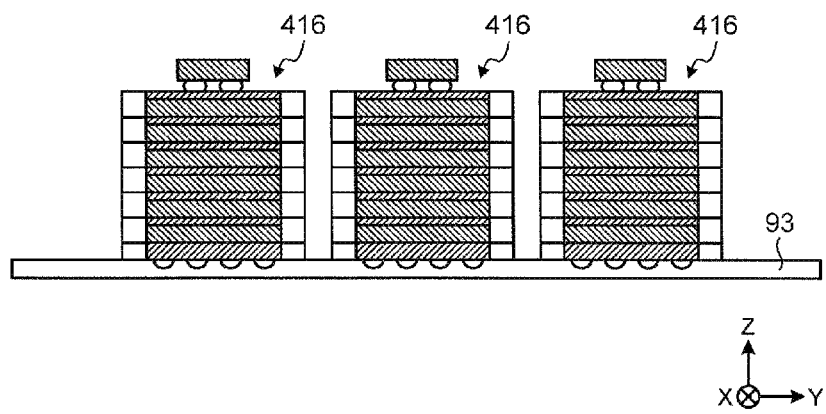

In the step illustrated in FIG. 15B, the +Z side of each stacked body 416 is detached from the adhesive tape 420a, to remove the adhesive tape 420a and the support substrate 421a. The plurality of stacked bodies 416 are arranged on the dicing tape 93, while the +Z side and the −Z side are inverted upside down such that the −Z-side surface of each of the stacked bodies 416 is adhered to the dicing tape 93. The plurality of stacked bodies 416 are arranged at intervals equal to or larger than the width of the dicing blade. The plurality of stacked bodies 416 may be arranged in a matrix form in the XY plan view on the dicing tape 93.

Figure 16A:
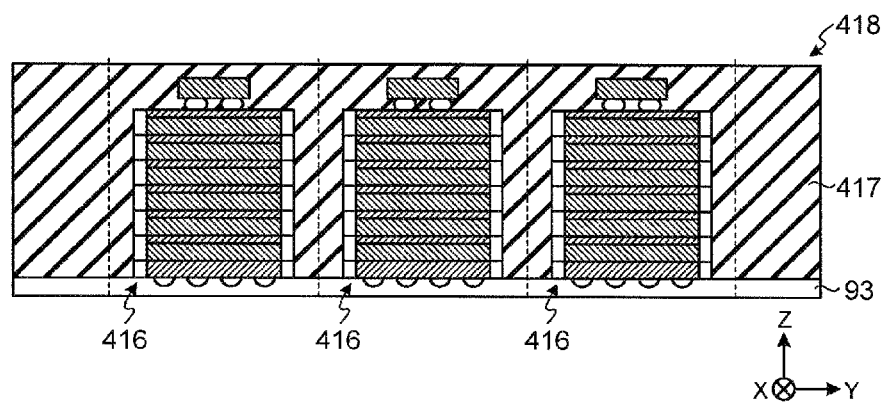
FIGS. 16A and 16B are cross-sectional views illustrating a semiconductor device manufacturing method according to a modification of the fifth embodiment.

In the step illustrated in FIG. 16A, the side surfaces of the plurality of separated stacked bodies 416 are covered with an insulator 417, or the side surfaces and the +Z-side surfaces of the plurality of separated stacked bodies 416 are covered with the insulator 417, so as to form a sealing body 418. The insulator 417 is formed of a material that contains an insulating material as a main component, and may be formed of a material that contains a resin having a light-shading property, an insulating property, and a thermoplasticity as a main component.

For the sealing body 418, the target positions of the dicing process are determined as indicated by dashed lines. As the target positions of the dicing process, positions that do not overlap with the stacked bodies 416 are selected. The target positions of the dicing process may be grid-like lines that partition the matrix-like arrangement of the plurality of stacked bodies 416.

Figure 16B:
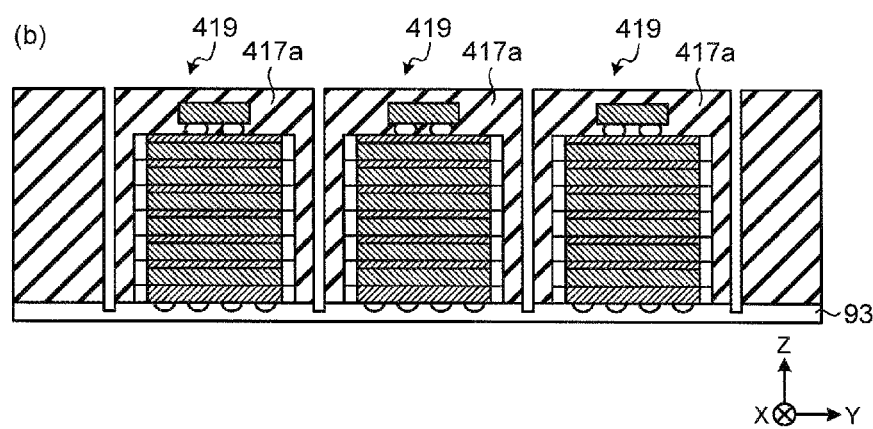

In the step illustrated in FIG. 16B, the dicing process is performed along the target positions to reach the dicing tape 93. As a result, the sealing body 418 is cut in the Z direction among the plurality of stacked bodies 416, and separated into a plurality of packages of semiconductor devices 419. Each semiconductor device 419 is obtained as a single stacked package by being detached from the dicing tape 93. In each semiconductor device 419, the +Z-side surface, the +X-side surface, the −X-side surface, the +Y-side surface, and the −Y-side surface of the stacked body 416 are covered with an insulator 417a having a light shading property.

As described above, in the fifth embodiment, the stacked substrate SSB is adhered to the support substrate in a state where the small-sized chips are mounted on the stacked substrate SSB, so as to form the stacked substrate SSB400. The stacked substrate SSB400 is cut in the stacking direction among the chip regions, sealed with a resin, and separated into the plurality of packages of semiconductor devices 419. As a result, the packages of the semiconductor devices 419 in which the small-sized chips coexist on the stacked bodies may be provided.

Figure 17:
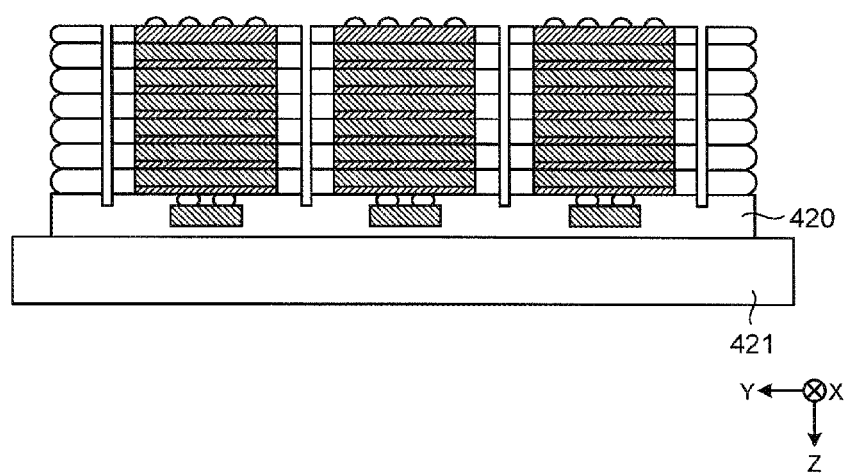
FIG. 17 is a cross-sectional view illustrating the semiconductor device manufacturing method according to the modification of the fifth embodiment.

Instead of the step illustrated in FIG. 15A, the step illustrated in FIG. 17 may be performed. In the step illustrated in FIG. 17, the dicing process is performed along the target positions indicated by the dashed lines in FIG. 14B to reach the adhesive tape 420. That is, the groove of the dicing process does not reach the support substrate 421. As a result, the support substrate 421 may be reused when the manufacturing of a semiconductor device is performed next. Further, the adhesion of the dicing tape 92 in the step of FIG. 14B may be omitted.

Sixth Embodiment

Next, a semiconductor device manufacturing method according to a sixth embodiment will be described. Hereinafter, descriptions will be made focusing on differences from the first to fifth embodiments.

While the first embodiment describes a method of forming a stacked substrate using a semiconductor substrate as a substrate, a sixth embodiment describes a method of forming a stacked substrate using an insulating substrate (e.g., a glass substrate) as a substrate.

Figure 18A:
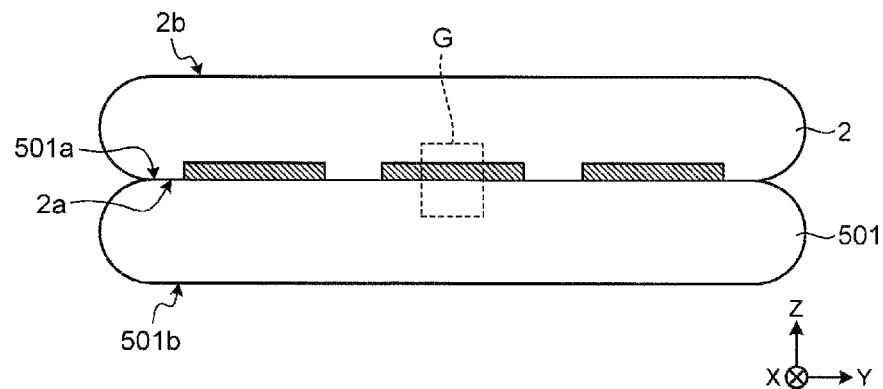
FIGS. 18A to 18C are cross-sectional views illustrating a semiconductor device manufacturing method according to a sixth embodiment.
Figure 18B:
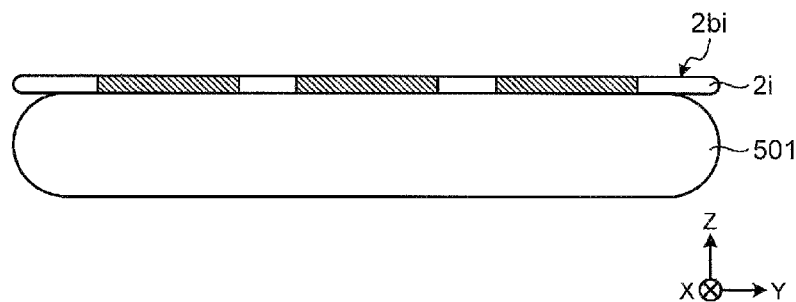
Figure 18C:
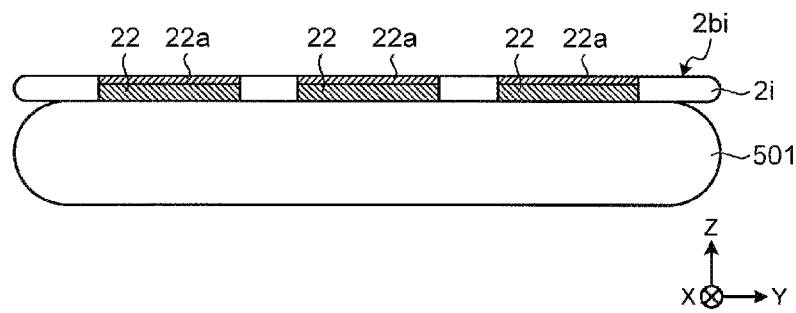
Figure 19:
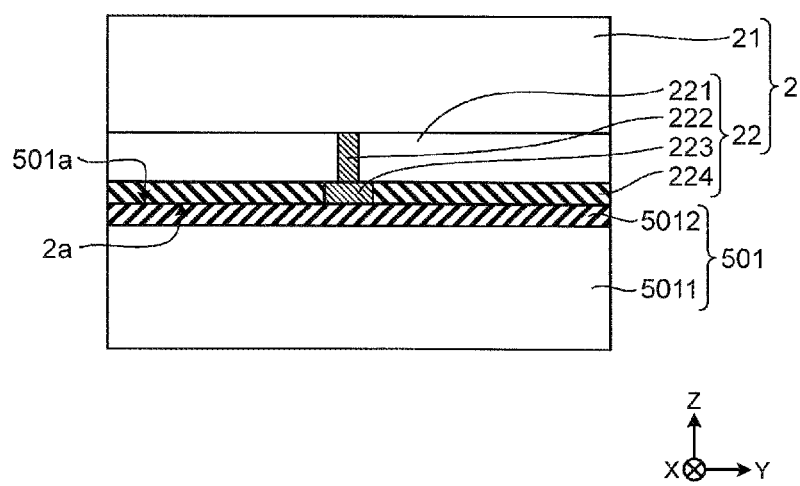
FIG. 19 is a cross-sectional view illustrating the semiconductor device manufacturing method according to the sixth embodiment.

Specifically, a semiconductor device is manufactured as illustrated in FIGS. 18A to 20C. FIGS. 18A to 18C and 20A to 20C are cross-sectional views illustrating the semiconductor device manufacturing method. FIG. 19 is an enlarged cross-sectional view of a portion G of FIG. 18C.

In the step illustrated in FIG. 18A, the same process as performed in the step of FIG. 1A is performed, except that the substrate 1 is replaced with a substrate 501. The substrate 501 is similar to the substrate 1 in that the substrate 501 has a substantially disk shape and has a substantially circular shape in the XY plan view. However, the substrate 501 is different from the substrate 1 in that the substrate 501 may be formed of a material that contains an insulating material (e.g., glass) as a main component. As illustrated in FIG. 19, an inorganic adhesive layer 5012 is formed on the front surface 501a of the substrate 501. The inorganic adhesive layer 5012 is formed on a base region 5011 in the substrate 501.

The front surface 2a of the substrate 2 is bonded to the front surface 501a of the substrate 501. For example, as illustrated in FIG. 19, the electrode 223 and the inorganic insulating film 224 of the substrate 2 are directly bonded to the inorganic adhesive layer 5012 of the substrate 501.

In the step illustrated in FIG. 18B, the same process as performed in the step of FIG. 1B is performed, except that the substrate 1 is replaced with the substrate 501.

In the step illustrated in FIG. 18C, the same process as performed in the step of FIG. 1C is performed, except that the substrate 1 is replaced with the substrate 501.

Figure 20A:
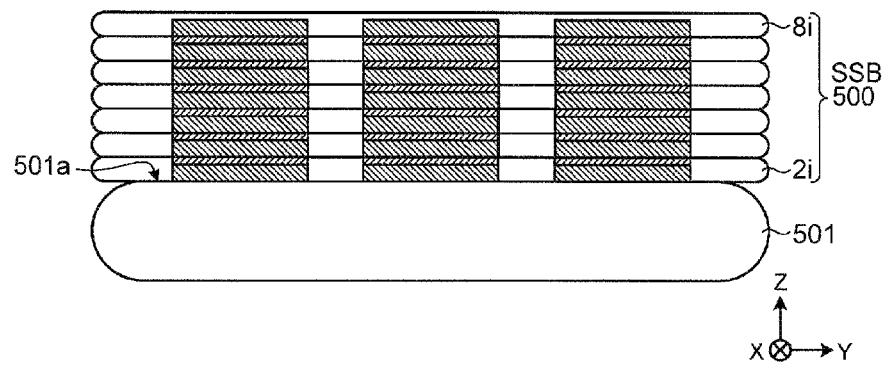
FIGS. 20A to 20C are cross-sectional views illustrating the semiconductor device manufacturing method according to the sixth embodiment.

In the step illustrated in FIG. 20A, the same processes as performed in the steps of FIGS. 3A to 3C and 5A are performed, except that the substrate 1 is replaced with the substrate 501. As a result, as illustrated in FIG. 20A, a structure in which a stacked substrate SSB500 is stacked on the front surface 1a of the substrate 501 is obtained. In the stacked substrate SSB500, the individually thinned substrates 2i to 8i are stacked in an order.

Figure 20B:
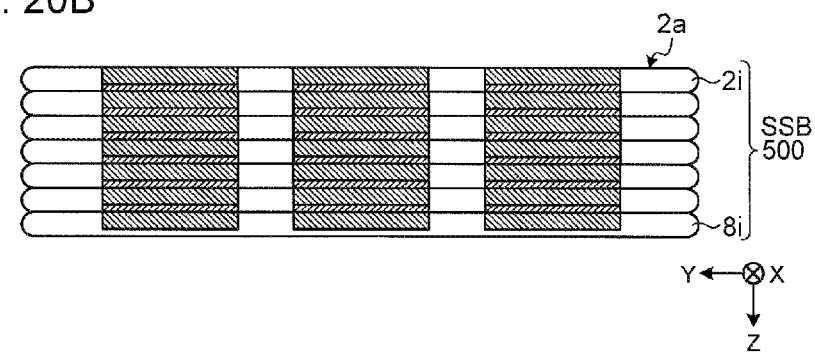

In the step illustrated in FIG. 20B, the substrate 501 is detached from the stacked substrate SSB500. For example, the substrate 501 may be detached from the stacked substrate SSB500 by irradiating the bonding interface between the substrate 501 and the stacked substrate SSB500 with a laser so as to, for example, melt the inorganic adhesive layer 5012. Then, the +Z side and the −Z side of the stacked substrate SSB500 are inverted upside down. In the stacked substrate SSB500, the substrate 1 is omitted, as compared with the stacked substrate SSB illustrated in FIG. 5B.

Figure 20C:
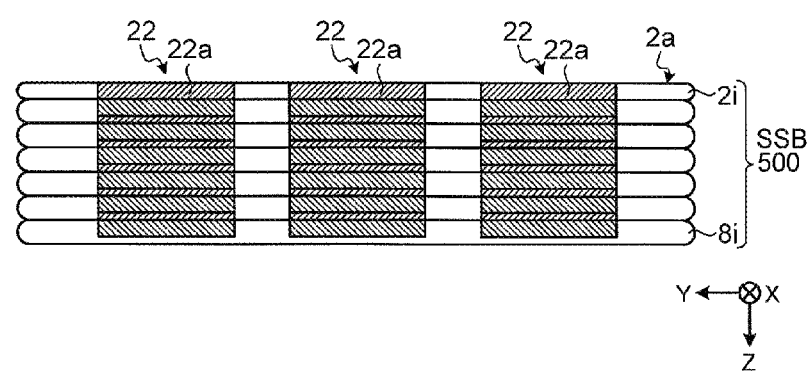

In the step illustrated in FIG. 20C, the rewiring layer 22a is formed in each chip region 22 of the front surface 2a of the substrate 2i. The electrode exposed in the −Z side of the rewiring layer 22a is electrically connected to the electrode 223 (see FIG. 2A). At this time, when the electrode 223 is not exposed in the front surface 2a of the substrate 2i, the rewiring layer 22a may be formed after the front surface 2a is polished until the electrode 223 is exposed.

Then, the step of FIG. 5C and the subsequent steps are performed as in the first embodiment.

As described above, in the sixth embodiment, the stacked substrate SSB500 is formed by using the insulating substrate (e.g., a glass substrate) as ae substrate. The stacked substrate SSB is cut in the stacking direction among the chip regions, and separated into the plurality of stacked bodies 96. In this method as well, the packages of the semiconductor devices 97 may be formed using the separated stacked bodies 96.

As illustrated in FIGS. 21A to 22C, the sixth embodiment may be combined with the fourth embodiment. FIGS. 21A to 22C are cross-sectional views illustrating a semiconductor device manufacturing method.

Figure 21A:
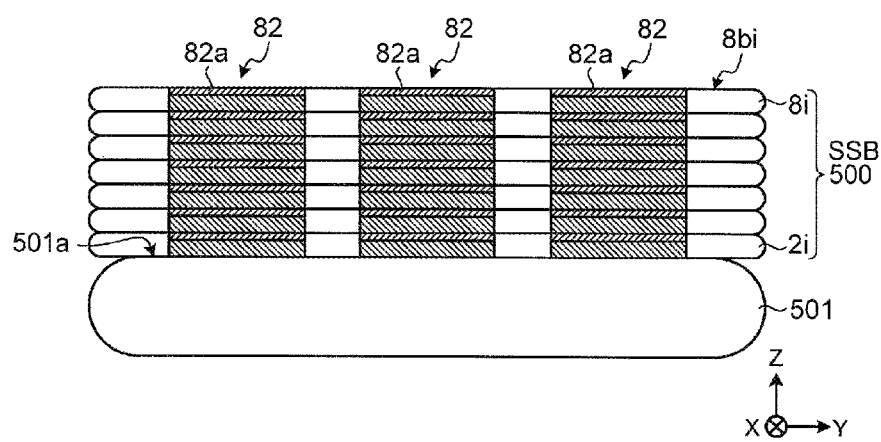
FIGS. 21A and 21B are cross-sectional views illustrating a semiconductor device manufacturing method according to a modification of the sixth embodiment.

In the step illustrated in FIG. 21A, after the structure in which the stacked substrate SSB500 is stacked on the front surface 1a of the substrate 501 as in the step illustrated in FIG. 20A, the rewiring layer 82a is formed in each chip region of the back surface 8bi of the substrate 8i. The electrode exposed in the −Z-side of the rewiring layer 82a is electrically connected to the electrode exposed in the back surface 8bi before the rewiring layer 82a is formed.

Figure 21B:
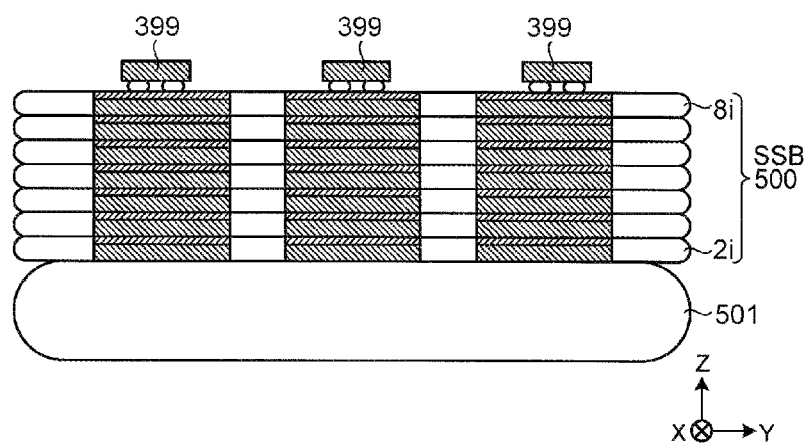

In the step illustrated in FIG. 21B, the same process as performed in the step illustrated in FIG. 10A is performed, except that the substrate 1 is replaced with the substrate 501.

Figure 22A:
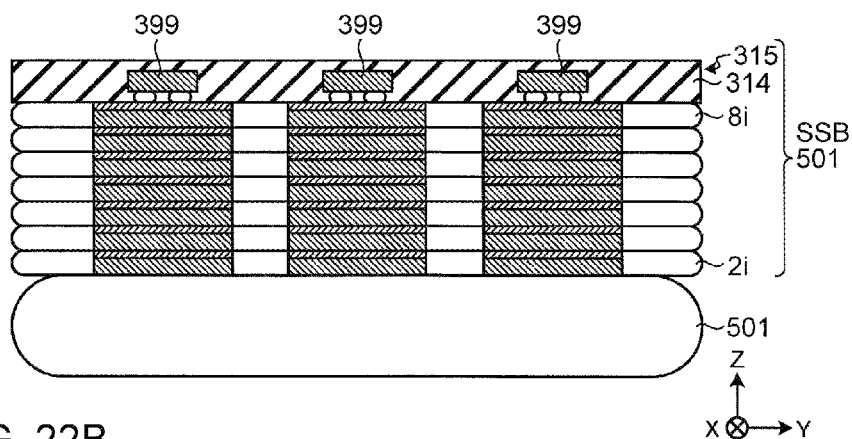
FIGS. 22A to 22C are cross-sectional views illustrating the semiconductor device manufacturing method according to the modification of the sixth embodiment.

In the step illustrated in FIG. 22A, the same process as performed in the step illustrated in FIG. 10B is performed, except that the substrate 1 is replaced with the substrate 501. As a result, the stacked substrate SSB501 is obtained in which the sealing body 314 is stacked as a pseudo substrate on the +Z side of the stacked substrate SSB 500.

Figure 22B:
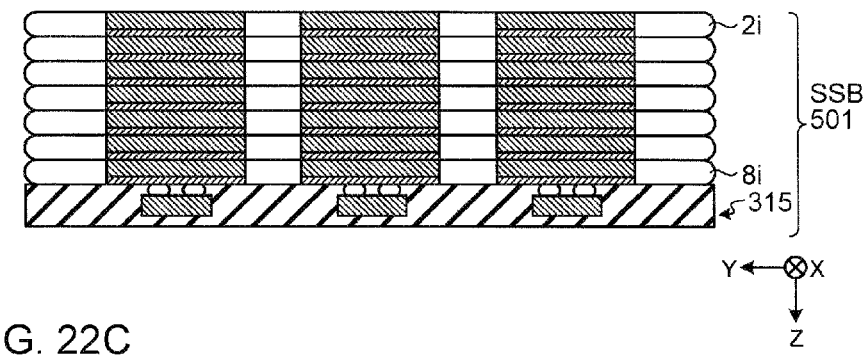

In the step illustrated in FIG. 22B, the substrate 501 is detached from the stacked substrate SSB501. For example, the substrate 501 may be detached from the stacked substrate SSB501, by irradiating the bonding interface between the substrate 501 and the stacked substrate SSB501 with a laser so as to, for example, melt the inorganic adhesive layer 5012 (see FIG. 19). Then, the +Z side and the −Z side of the stacked substrate SSB501 are inverted upside down. In the stacked substrate SSB501, the substrate 1$i$ is omitted, as compared with the stacked substrate SSB300 illustrated in FIG. 10A.

Figure 22C:
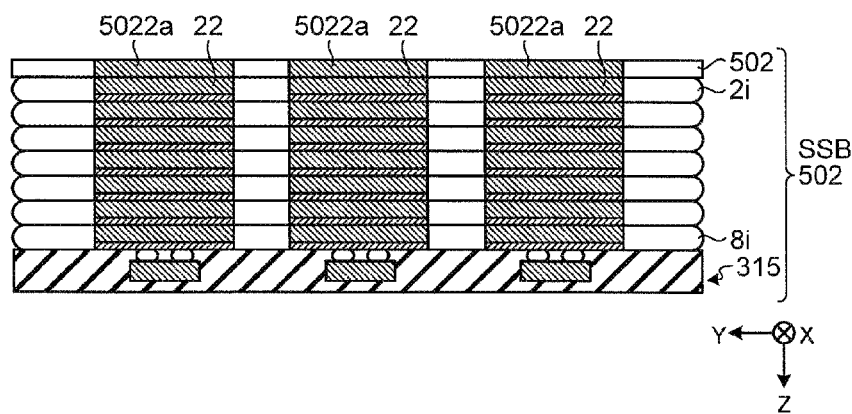

In the step illustrated in FIG. 22C, an organic substrate 502 is prepared. The organic substrate 502 is formed in the same planar shape and planar dimension as those of each of the substrates 2$i$ to 8$i$ in the stacked substrate SSB501. The organic substrate 502 is stacked on the −Z side of the stacked substrate SSB501 in the same manner as a build-up method. As a result, a stacked substrate SSB502 is formed in which the organic substrate 502 is stacked on the −Z side of the stacked substrate SSB501. Then, a rewiring layer 5022$a$ is formed in a region that corresponds to each chip region 22 in the organic substrate 502. As compared with the stacked substrate SSB300 illustrated in FIG. 10A, the stacked substrate SSB502 includes the organic substrate 502 stacked thereon, instead of the substrate 1$i$.

Then, the step of FIG. 11B and the subsequent steps are performed as in the fourth embodiment.

In this method as well, the packages of the semiconductor devices 319 in which small-sized chips coexist on the stacked bodies may be provided.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a stacked body in which a plurality of chips is stacked; and
   a conductive film configured to cover a side surface and a bottom surface of the stacked body,
   wherein the stacked body includes:
      a first chip having a first main surface in which an electrode and an inorganic insulating film are disposed,
      a second chip stacked on the first chip, and having a second main surface in which an electrode is bonded to the electrode of the first main surface, wherein an inorganic insulating film is bonded to the inorganic insulating film of the first main surface, and a third main surface in which an electrode and an inorganic insulating film are disposed,
      a third chip stacked on the second chip, and having a fourth main surface in which an electrode is bonded to the electrode of the third main surface, and an inorganic insulating film is bonded to the inorganic insulating film of the third main surface.

2. The semiconductor device according to claim 1, further comprising:
   an insulating sealant arranged to cover at least a back surface of the stacked body.

3. A semiconductor device comprising:
   a stacked body in which a plurality of chips is stacked,
   wherein the stacked body includes:
      a first chip having a first main surface in which an electrode and an inorganic insulating film are disposed,
      a second chip stacked on the first chip, and having a second main surface in which an electrode is bonded to the electrode of the first main surface, wherein an inorganic insulating film is bonded to the inorganic insulating film of the first main surface, and a third main surface in which an electrode and an inorganic insulating film are disposed, and the second chip having a first region formed of a pattern of the second chip, the first region disposed on a side of the second main surface, and a wiring layer disposed on a side of the third main surface,
      a third chip stacked on the second chip, and having a fourth main surface in which an electrode is bonded to the electrode of the third main surface, and an inorganic insulating film is bonded to the inorganic insulating film of the third main surface, and the third chip having a second region formed of a pattern of the third chip, the second region disposed on a side of the fourth main surface and bonded with the wiring layer disposed on the side of the third main surface.

4. The semiconductor device according to claim 3, wherein
   the first region disposed on the side of the second main surface includes the electrode bonded to the electrode of the first main surface and the inorganic insulating film bonded to the inorganic insulating film of the first main surface,
   the wiring layer includes the electrode of the third main surface and the inorganic insulating film disposed on the third main surface, and
   the second region disposed on the side of the fourth main surface includes the electrode bonded to the electrode of the third main surface and the inorganic insulating film bonded to the inorganic insulating film of the third main surface.

* * * * *